United States Patent
Sugawara

(10) Patent No.: US 9,893,088 B2
(45) Date of Patent: Feb. 13, 2018

(54) THIN FILM TRANSISTOR DEVICE, METHOD FOR MANUFACTURING SAME AND DISPLAY DEVICE

(71) Applicant: JOLED INC., Tokyo (JP)

(72) Inventor: Yuta Sugawara, Tokyo (JP)

(73) Assignee: JOLED INC., Tokyo (JP)

( * ) Notice: Subject to any disclaimer, the term of this patent is extended or adjusted under 35 U.S.C. 154(b) by 2 days.

(21) Appl. No.: 14/894,148

(22) PCT Filed: Apr. 24, 2014

(86) PCT No.: PCT/JP2014/002299
§ 371 (c)(1),
(2) Date: Nov. 25, 2015

(87) PCT Pub. No.: WO2014/192221
PCT Pub. Date: Dec. 4, 2014

(65) Prior Publication Data
US 2016/0133650 A1 May 12, 2016

(30) Foreign Application Priority Data
May 29, 2013 (JP) ................................. 2013-112740

(51) Int. Cl.
*H01L 27/12* (2006.01)
*H01L 29/786* (2006.01)
(Continued)

(52) U.S. Cl.
CPC ...... *H01L 27/1225* (2013.01); *H01L 27/1248* (2013.01); *H01L 27/3262* (2013.01);
(Continued)

(58) Field of Classification Search
CPC ..................... H01L 27/1248; H01L 27/3258
See application file for complete search history.

(56) References Cited

U.S. PATENT DOCUMENTS 4,368,573 A * 1/1983 deBrebisson ......... H01L 21/033
257/552
5,443,922 A 8/1995 Nishizaki et al.
(Continued)

FOREIGN PATENT DOCUMENTS

| JP | 05-163488 | 6/1993 |
| JP | 2008-166716 | 7/2008 |

(Continued)

OTHER PUBLICATIONS

International Search Report in PCT/JP2014/002299, dated Aug. 5, 2014.
U.S. Appl. No. 14/894,027 to Yuta Sugawara, filed Nov. 25, 2015.

*Primary Examiner* — Bryan Junge
(74) *Attorney, Agent, or Firm* — Greenblum & Bernstein, P.L.C.

(57) ABSTRACT

A thin film transistor device including: a substrate; a gate electrode; an electrode pair composed of a source electrode and a drain electrode; a channel layer; and a passivation layer. The channel layer is made of an oxide semiconductor. The passivation layer includes a first layer, a second layer, and a third layer layered one on top of another in this order with the first layer closest to the substrate. The first layer is made of one of silicon oxide, silicon nitride, and silicon oxynitride, the second layer is made of an Al compound, and the third layer is made of one of silicon oxide, silicon nitride, and silicon oxynitride.

3 Claims, 21 Drawing Sheets

(51) Int. Cl.
  *H01L 29/417* (2006.01)
  *H01L 29/423* (2006.01)
  *H01L 29/66* (2006.01)
  *H01L 27/32* (2006.01)
  *H01L 51/52* (2006.01)
  *G02F 1/1362* (2006.01)

(52) U.S. Cl.
  CPC .. *H01L 29/41733* (2013.01); *H01L 29/42384* (2013.01); *H01L 29/66742* (2013.01); *H01L 29/66969* (2013.01); *H01L 29/7869* (2013.01); *G02F 1/1362* (2013.01); *H01L 27/3248* (2013.01); *H01L 27/3258* (2013.01); *H01L 51/5253* (2013.01)

(56) References Cited

U.S. PATENT DOCUMENTS

| | | |
|---|---|---|
| 8,742,418 B2 | 6/2014 | Morosawa et al. |
| 2010/0051936 A1 | 3/2010 | Hayashi et al. |
| 2011/0175646 A1* | 7/2011 | Takemura ........ H03K 19/17784 326/44 |
| 2011/0180802 A1 | 7/2011 | Morosawa et al. |
| 2013/0161610 A1* | 6/2013 | Yamazaki ........... H01L 29/7869 257/43 |
| 2014/0117359 A1* | 5/2014 | Yuan ................... H01L 29/4908 257/59 |
| 2014/0139772 A1* | 5/2014 | Kim .................... H01L 27/3258 349/43 |
| 2015/0076467 A1* | 3/2015 | Sasaki ................ H01L 29/7869 257/40 |
| 2015/0099327 A1* | 4/2015 | Higashi ................. C09K 13/06 438/104 |
| 2015/0194475 A1* | 7/2015 | Kawashima ........ H01L 29/7869 257/40 |

FOREIGN PATENT DOCUMENTS

| | | |
|---|---|---|
| JP | 2010-114413 | 5/2010 |
| JP | 2012-212714 | 11/2012 |
| JP | 2014-086717 | 5/2014 |

* cited by examiner

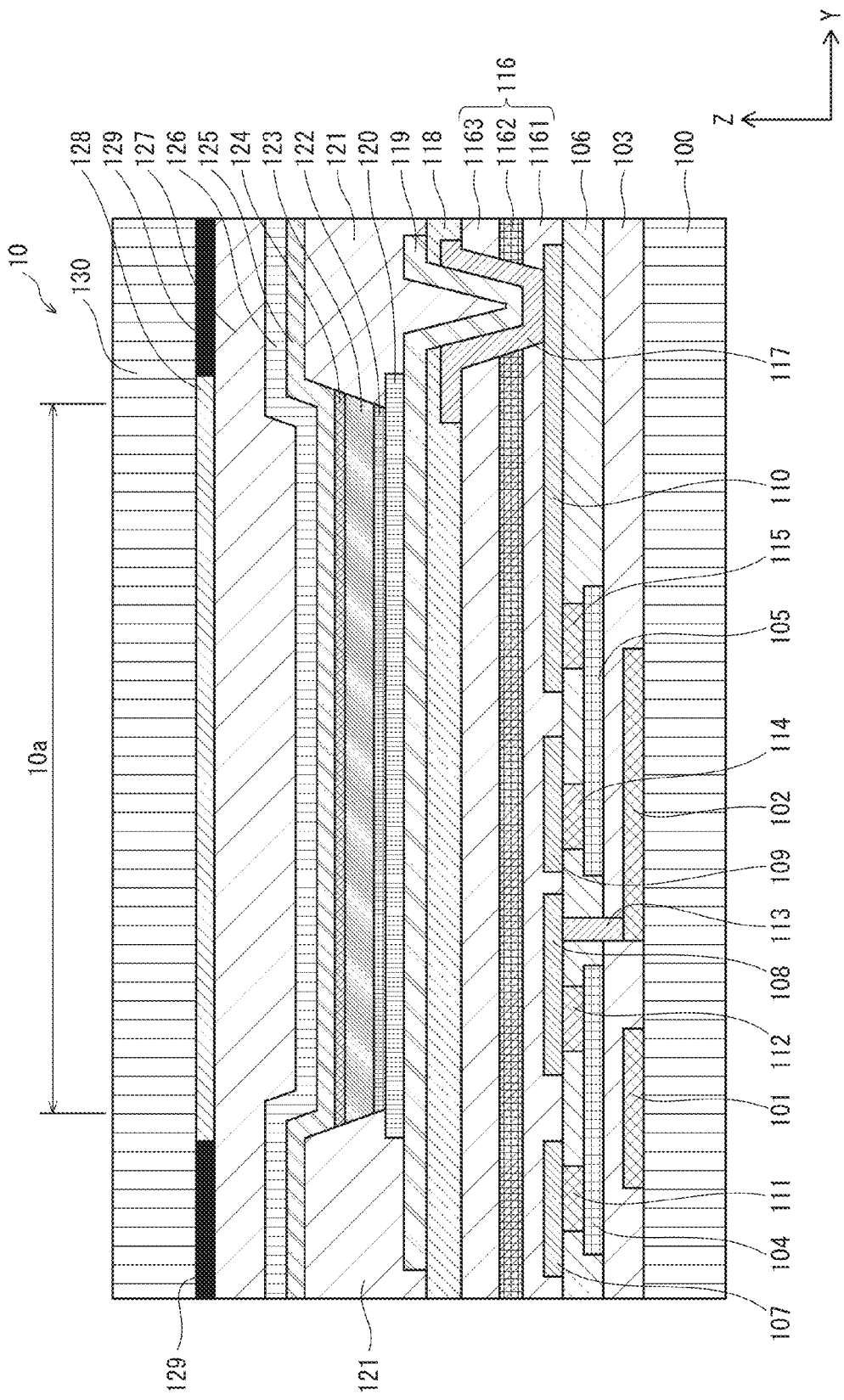

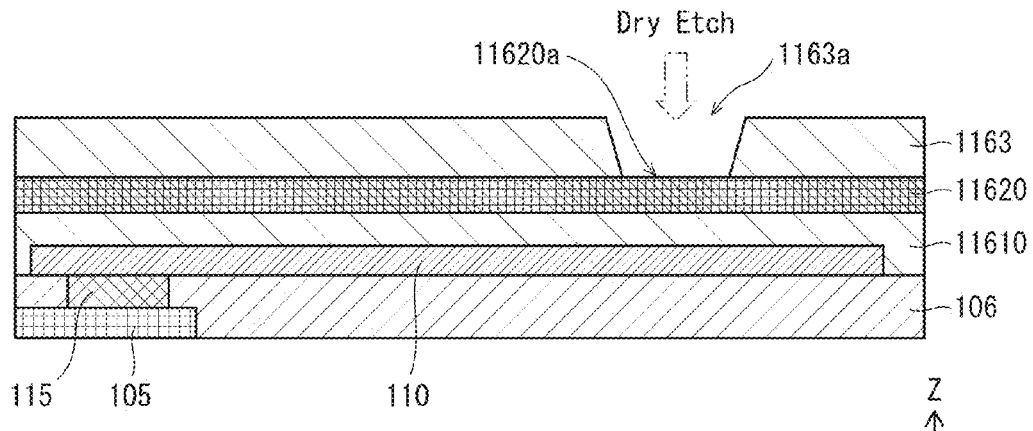
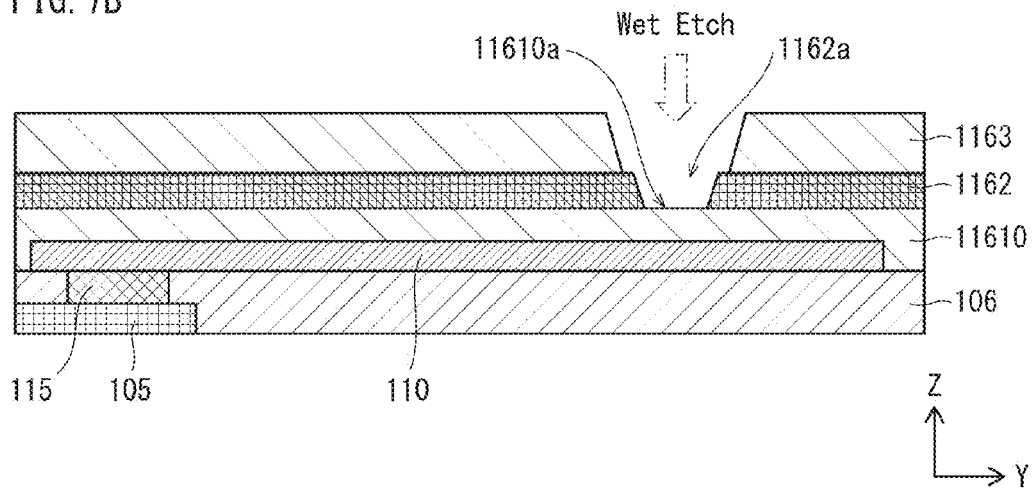
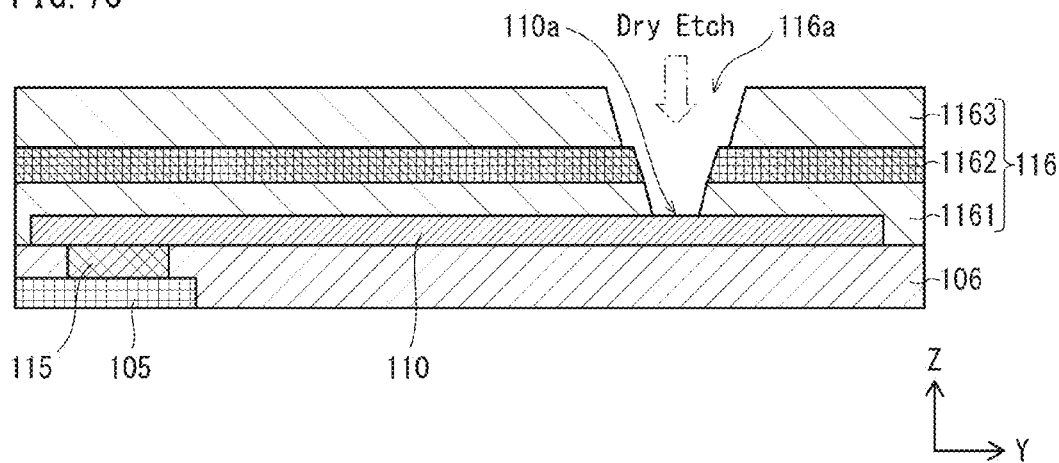

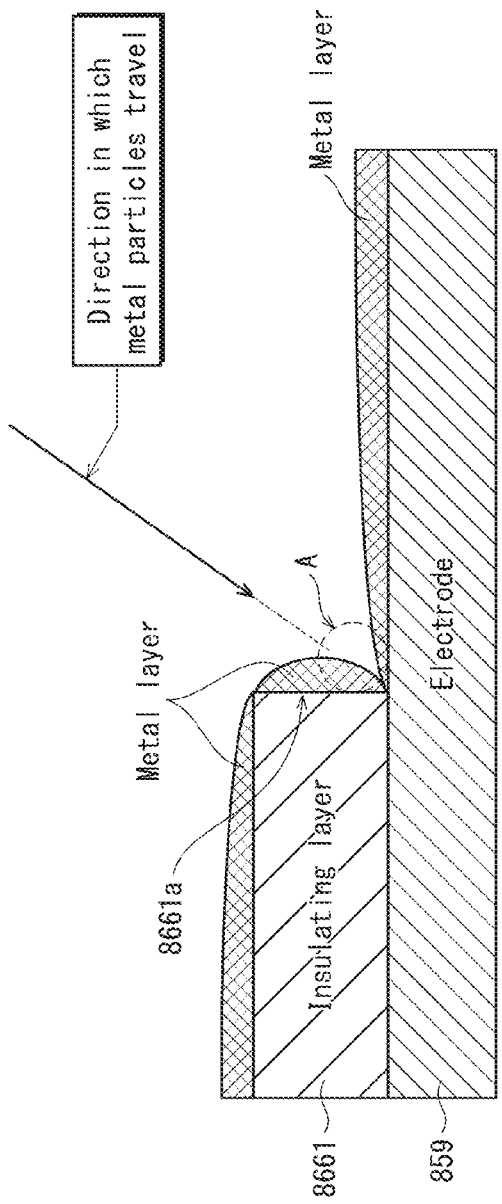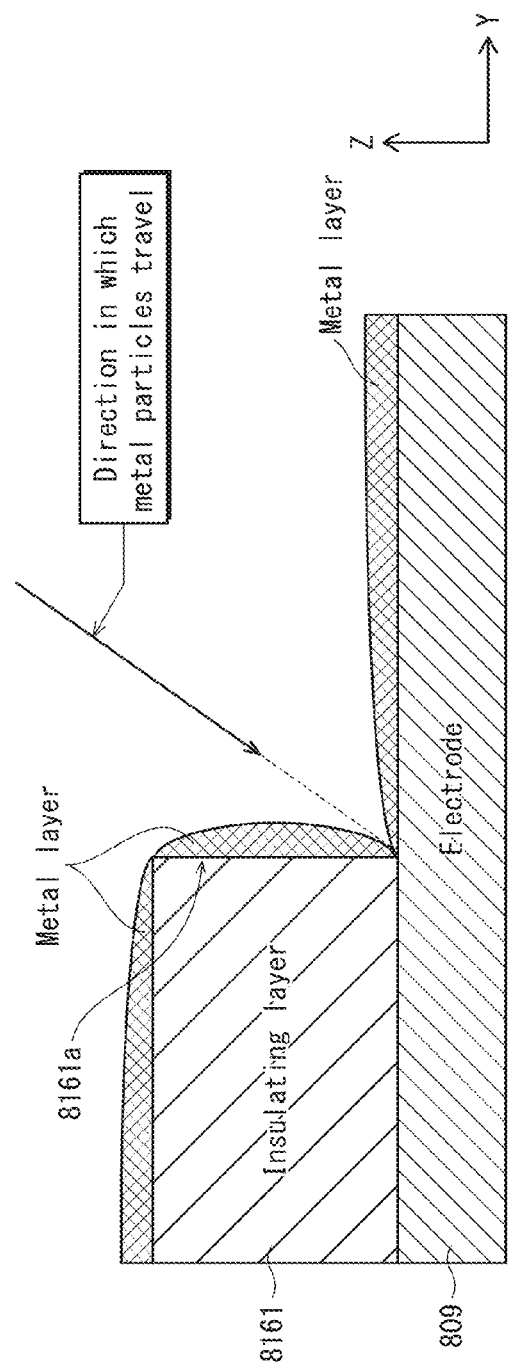

FIG. 14
(a)
(b)
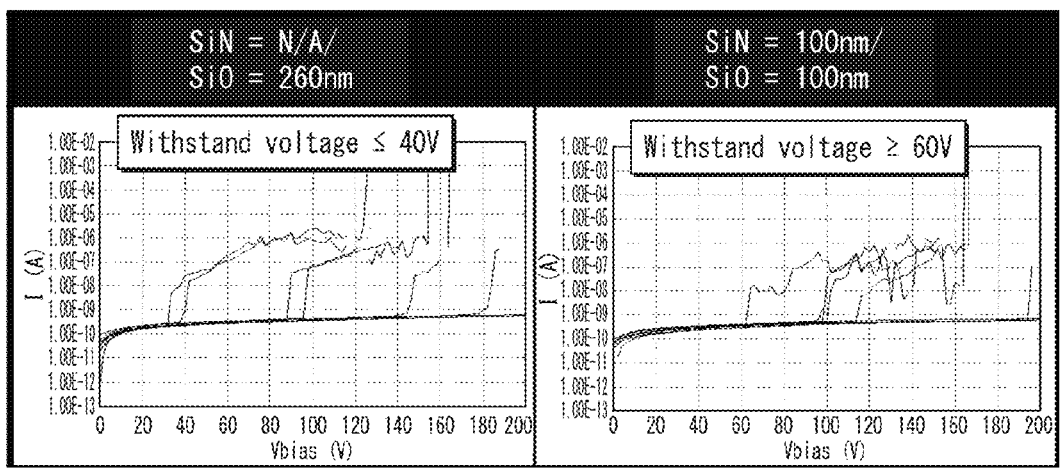
(c)
(d)
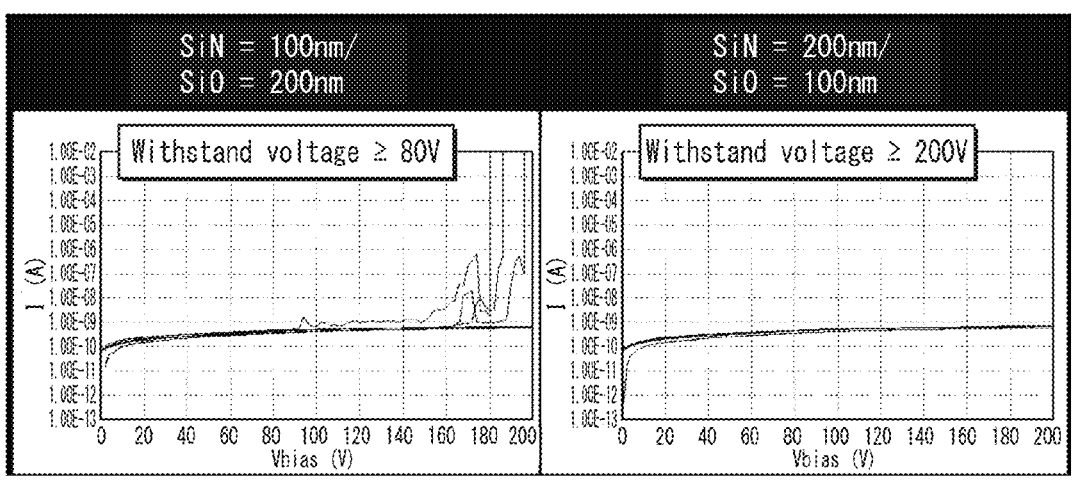

FIG. 16A
FIG. 16B
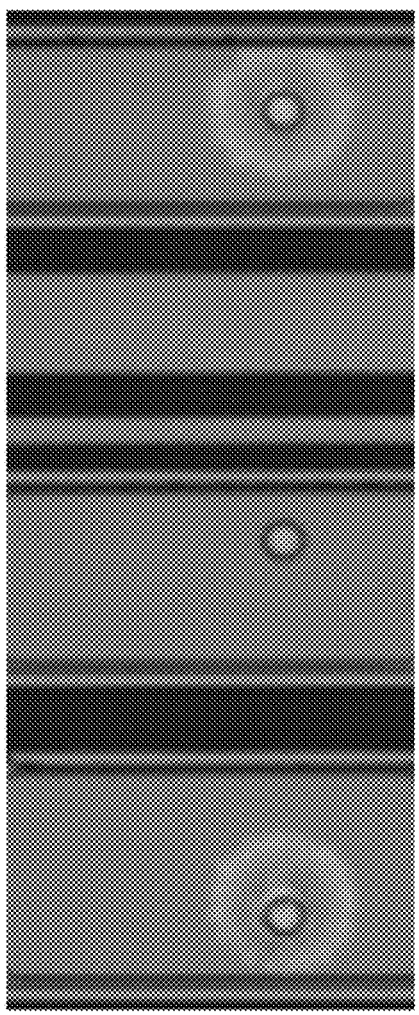
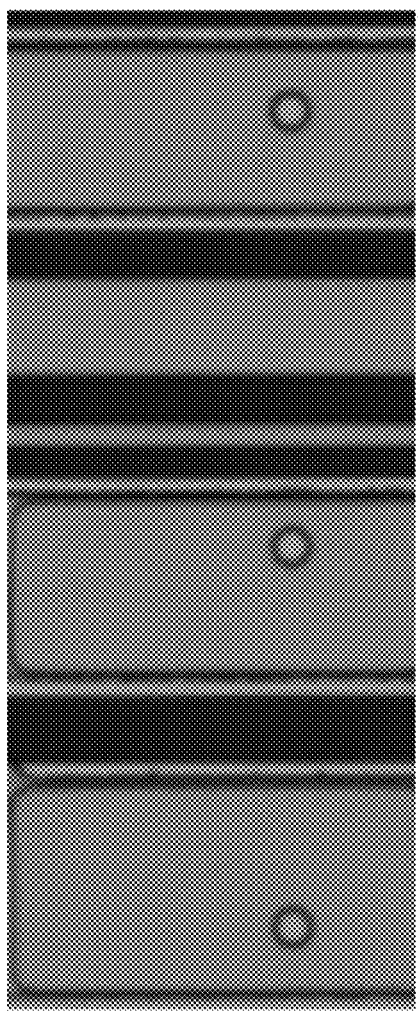

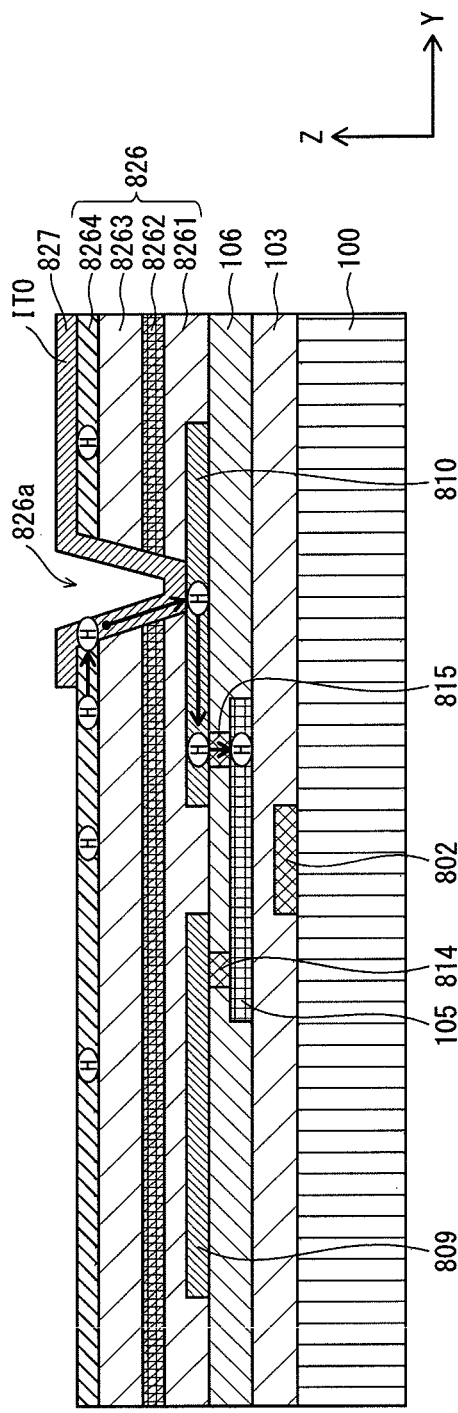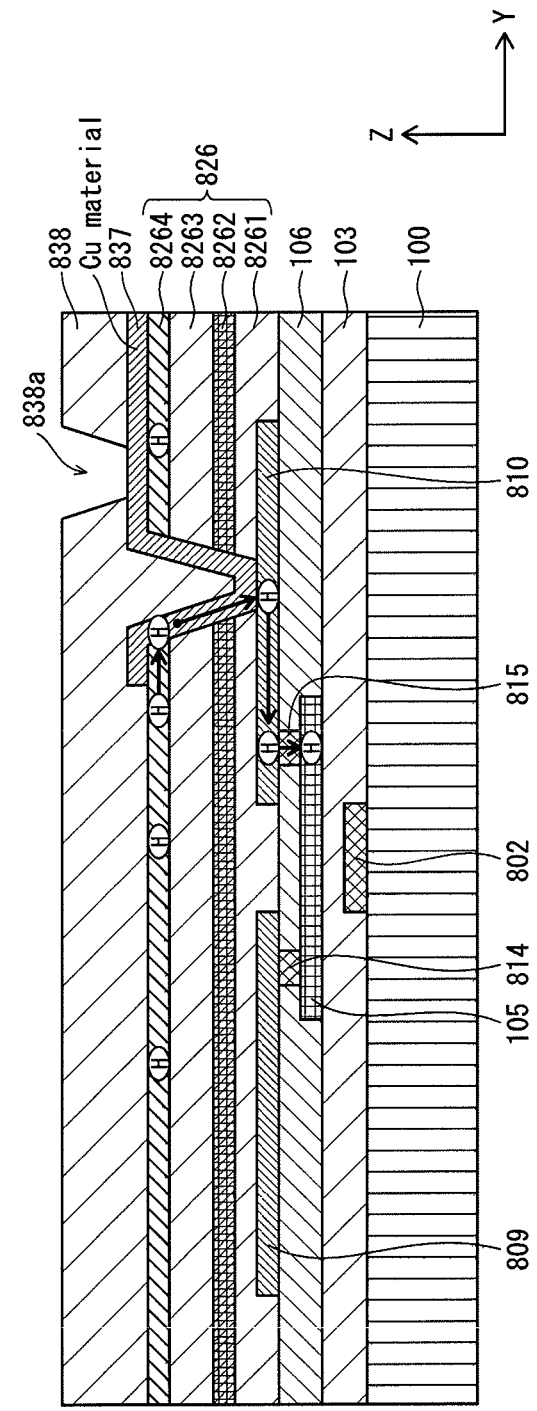

|  |  | Sample 1 | Sample 2 | Sample 3 |
|---|---|---|---|---|
| SiN film forming conditions | Temperature (°C) | 290 | 290 | 290 |
|  | Power density (W/cm$^2$) | 0.309 | 0.160 | 0.160 |
|  | Space (mils) | 800 | 650 | 650 |
|  | Pressure (Pa) | 199.98 | 186.60 | 133.32 |
|  | $N_2$ (sccm) | 580.00 | 630.00 | 630.00 |
|  | $NH_3$ (sccm) | 33000 | 25000 | 25000 |
|  | $SiH_4$ (sccm) | 4670 | 1800 | 2200 |
| SiN film characteristics | Deposition rate (mean) (nm/min) | | 166.7 | 77.3 | 76.5 |
|  | Stress wf (MPa) | $P_{edge}$ | −104.6 | −125.0 | −361.2 |
|  |  | $P_{cent}$ | 43.5 | 84.8 | −270.4 |
|  | SiH/NH | $P_{edge}$ | 0.461 | 0.060 | 0.066 |
|  |  | $P_{cent}$ | 0.645 | 0.080 | 0.072 |

THIN FILM TRANSISTOR DEVICE, METHOD FOR MANUFACTURING SAME AND DISPLAY DEVICE

TECHNICAL FIELD

The present invention relates to a thin film transistor device, a manufacturing method of the thin film transistor device, and a display device.

BACKGROUND ART

An active-matrix-type display device typically includes a TFT device that has a plurality of thin film transistor (TFT) elements, for achieving driving and light emission in units of sub-pixels. In connection with this, recently, TFT devices with a channel layer made of an oxide semiconductor are in development, for use in display devices and the like (refer to Patent Literature 1). The following describes a conventional TFT device with a channel layer made of an oxide semiconductor, with reference to FIG. 21.

The conventional TFT device illustrated in FIG. 21 includes a substrate 900. Further, the conventional TFT device includes, disposed above the substrate one on top of another in the stated order: a gate electrode 901; a gate insulating film 903; a channel layer 904; a channel protection film 906; a combination of a source electrode 907 and a drain electrode 908; and a passivation film 916. In this example, the gate insulating film 903 is composed of two layers, namely a silicon material insulating layer 9031 and an aluminum oxide layer 9032. Similarly, each of the channel protection film 906 and the passivation film 916 is a combination of an aluminum oxide layer and a silicon material insulating layer. Namely, the channel protection film 906 is composed of an aluminum oxide layer 9061 and a silicon material insulating layer 9062, and the passivation film 916 is composed of an aluminum oxide layer 9161 and a silicon material insulating layer 9162.

Further, in this example, the source electrode 907 and the drain electrode 908 are each composed of three layers, or more specifically, a Mo layer, an Al layer, and a Ti layer. Namely, the source electrode 907 is composed of a Mo layer 9071, an Al layer 9072, and a Ti layer 9073, and the drain electrode 908 is composed of a Mo layer 9081, an Al layer 9082, and a Ti layer 9083.

In the conventional TFT device illustrated in FIG. 21, due to the gate insulating film 903, the channel protection film 906, and the passivation film 916, which are located at the respective positions above or below the channel layer 904, including the aluminum oxide layers 9032, 9061, 9161 respectively, hydrogen is prevented from reaching the channel layer 904. Thus, the channel layer 904 can be prevented from being deoxidized by moisture and/or hydrogen present in the atmosphere, and further, the channel layer 904 is also prevented from losing oxygen and the like contained therein.

Meanwhile, in the conventional TFT device illustrated in FIG. 21, wiring is connected to the source electrode 907 and the drain electrode 908 via a contact hole formed in the passivation film 916.

CITATION LIST

Patent Literature

[Patent Literature 1]
  Japanese Patent Application Publication No. 2010-114413

SUMMARY OF INVENTION

However, the aluminum oxide layer 9161 of the passivation film 916 is difficult to process, and the characteristics and the thickness of the aluminum oxide layer 9161 have a great influence in the forming of the contact hole. Due to this, in the conventional TFT device illustrated in FIG. 21, where the aluminum oxide layer 9161 is located directly on the source electrode 907 and the drain electrode 908, there is a risk of the source electrode 907 and the drain electrode 908 being damaged in the forming of the hole in the aluminum oxide layer 9161. Thus, the yield and efficiency in the manufacturing of the conventional TFT device illustrated in FIG. 21 are low.

Further, while not disclosed in Patent Literature 1, similar problems are expected to occur with a passivation film including an aluminum nitride layer or an aluminum oxynitride layer.

The present invention aims to provide a solution to the above-described problem, and aims to provide a TFT device that can be manufactured with high yield and while suppressing degradation of a channel layer made of an oxide semiconductor, a method of manufacturing such a TFT device, and a display device provided with such a TFT device.

One aspect of the present disclosure is a thin film transistor device (referred to in the following as a TFT device) including: (i) a substrate; (ii) a gate electrode; (iii) an electrode pair composed of a source electrode and a drain electrode; (iv) a channel layer; and (v) a passivation layer.

The gate electrode is above the substrate. The channel layer is above the gate electrode. The electrode pair is on the channel layer, and the source electrode and the drain electrode are spaced away from one another. The passivation layer extends over the gate electrode, the channel layer, and the electrode pair, and has a hole penetrating therethrough in a thickness direction.

The channel layer is made of an oxide semiconductor. The passivation layer includes a first layer, a second layer, and a third layer layered one on top of another in this order with the first layer closest to the substrate. The first layer is made of one of silicon oxide, silicon nitride, and silicon oxynitride, the second layer is made of an Al compound, and the third layer made of one of silicon oxide, silicon nitride, and silicon oxynitride.

The TFT device pertaining to one aspect of the present disclosure can be manufactured with high yield and while suppressing degradation of a channel layer made of an oxide semiconductor.

BRIEF DESCRIPTION OF DRAWINGS

FIG. 3 is a schematic cross-sectional diagram illustrating the structure of each subpixel 10a of the display panel 10.

Each of FIGS. 4A through 4D is a schematic cross-sectional diagram illustrating a process in the manufacturing of the display panel 10.

Each of FIGS. 5A through 5D is a schematic cross-sectional diagram illustrating a process in the manufacturing of the display panel 10.

Figure 6A:
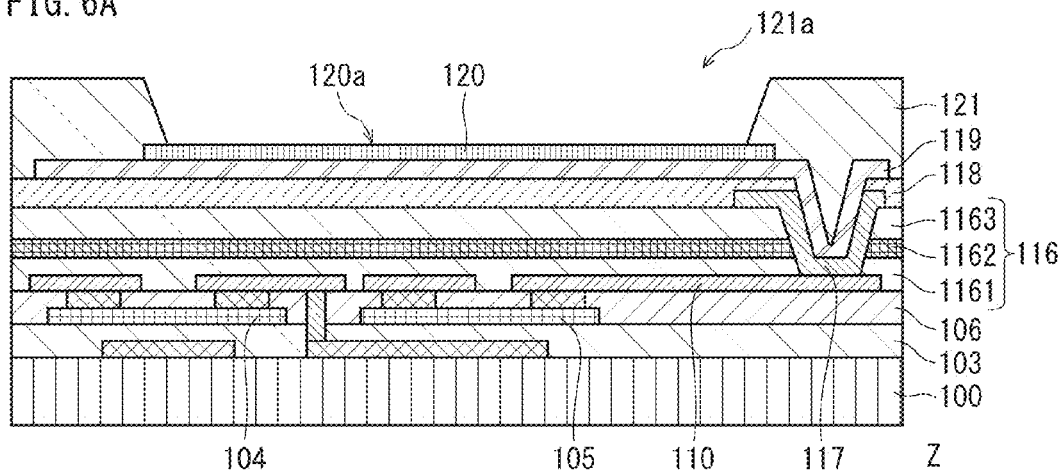
Figure 6B:
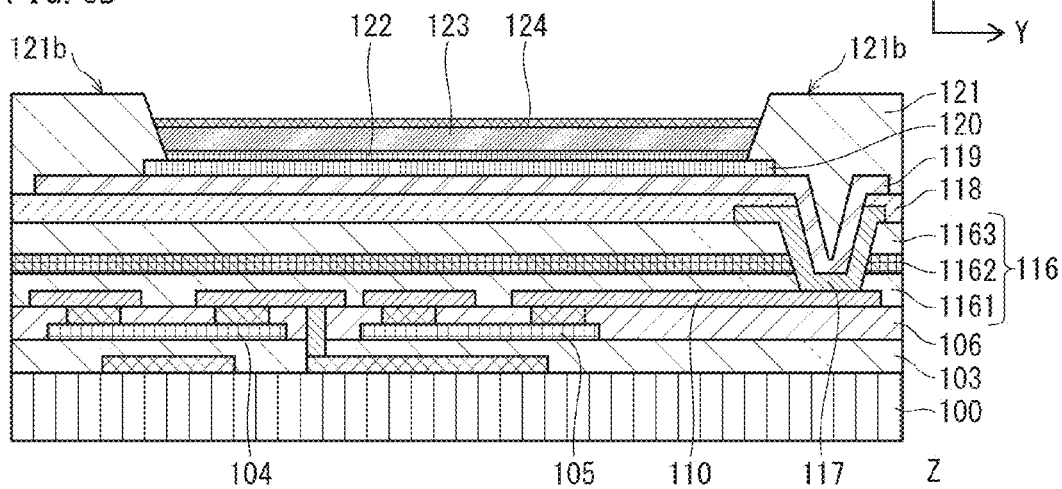
Figure 6C:
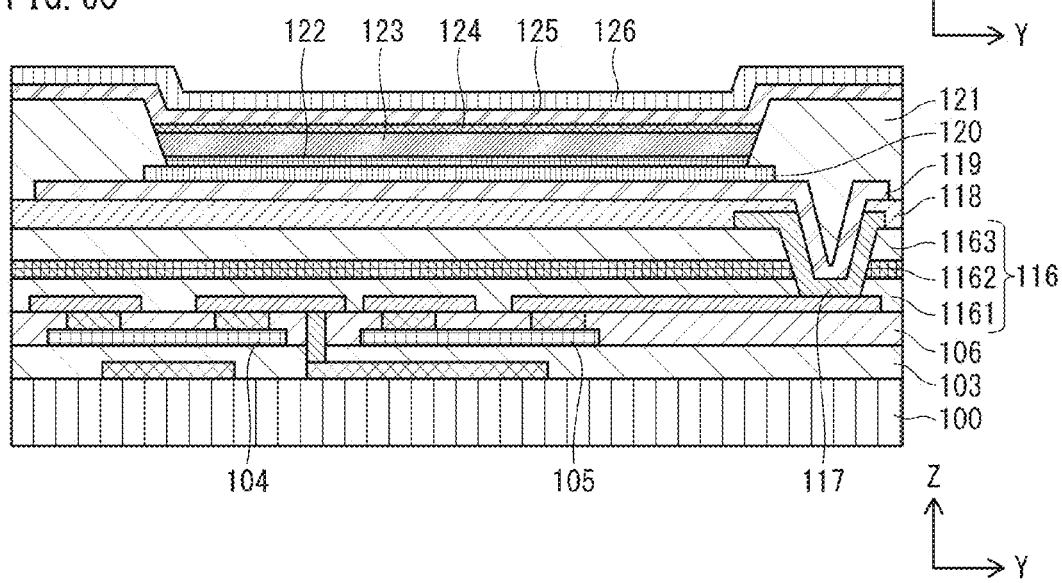

Each of FIGS. 6A through 6C is a schematic cross-sectional diagram illustrating a process in the manufacturing of the display panel 10.

Each of FIGS. 7A through 7C is a schematic cross-sectional diagram illustrating a state of a perform in a processing of forming a contact hole 116a in a passivation layer 116, among the processes for manufacturing the display panel 10.

Figure 8:
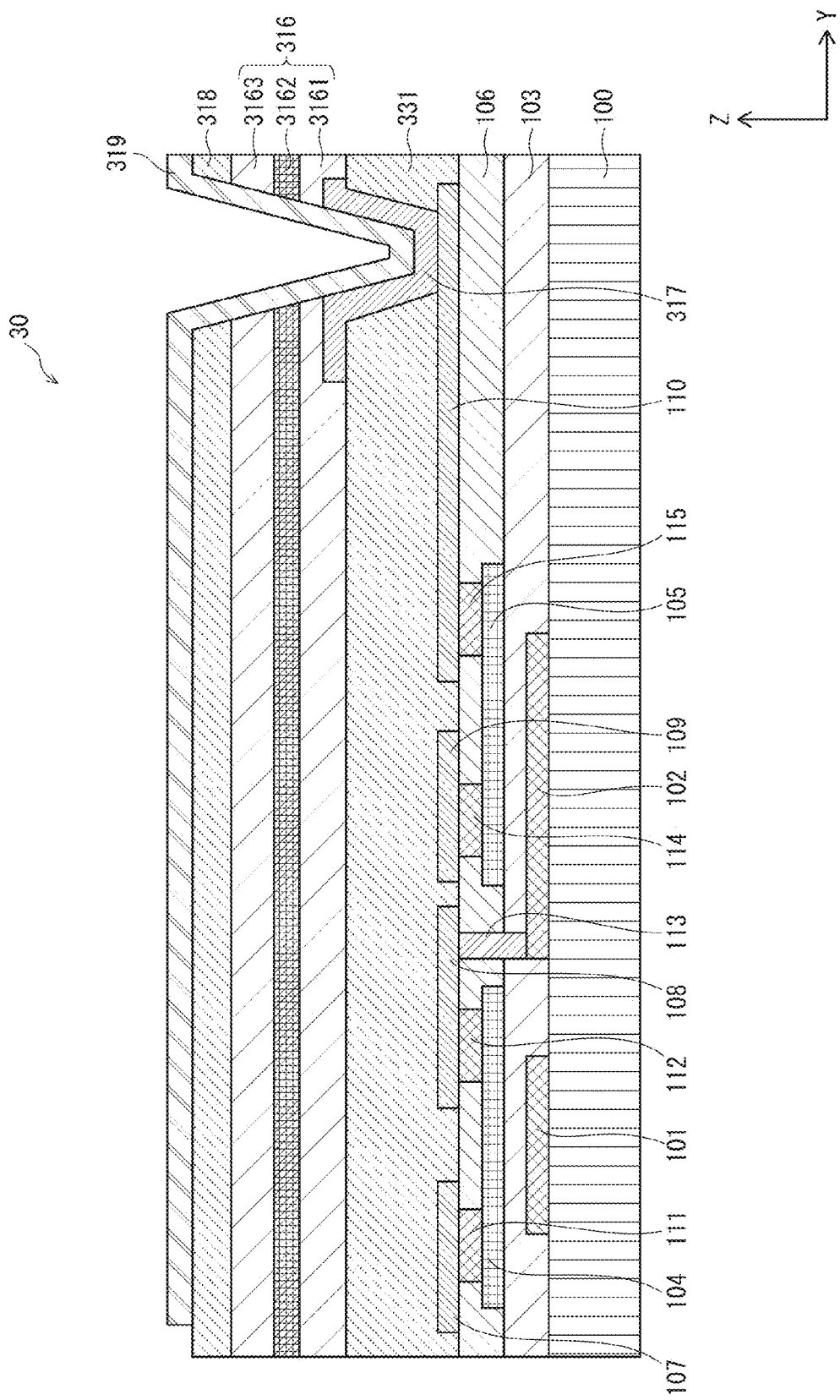

FIG. 8 is a schematic cross-sectional diagram illustrating the structure of one part of a display panel 30 pertaining to embodiment 2 of the present disclosure.

Figure 9:
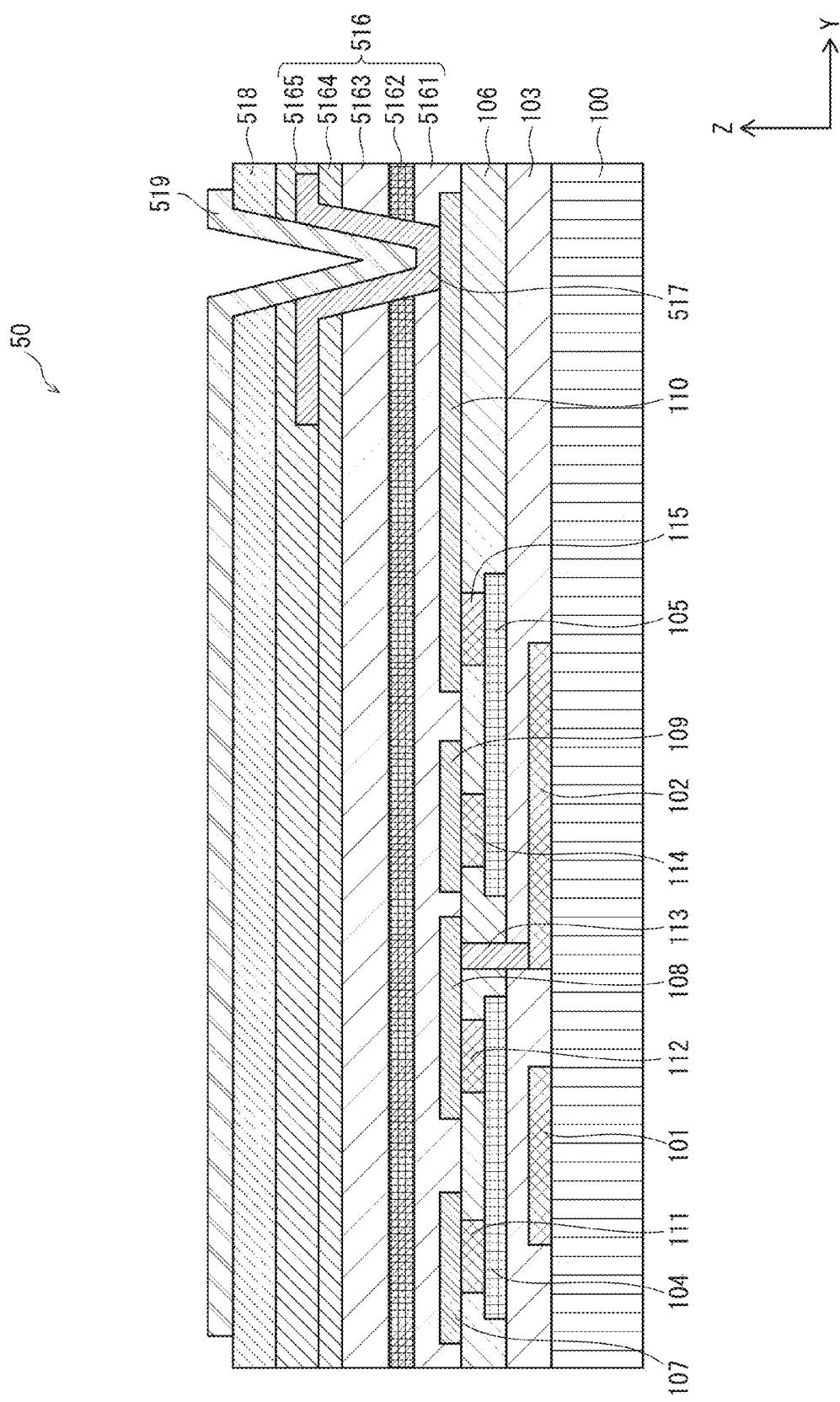

FIG. 9 is a schematic cross-sectional diagram illustrating the structure of one part of a display panel 50 pertaining to embodiment 3 of the present disclosure.

Figure 10:
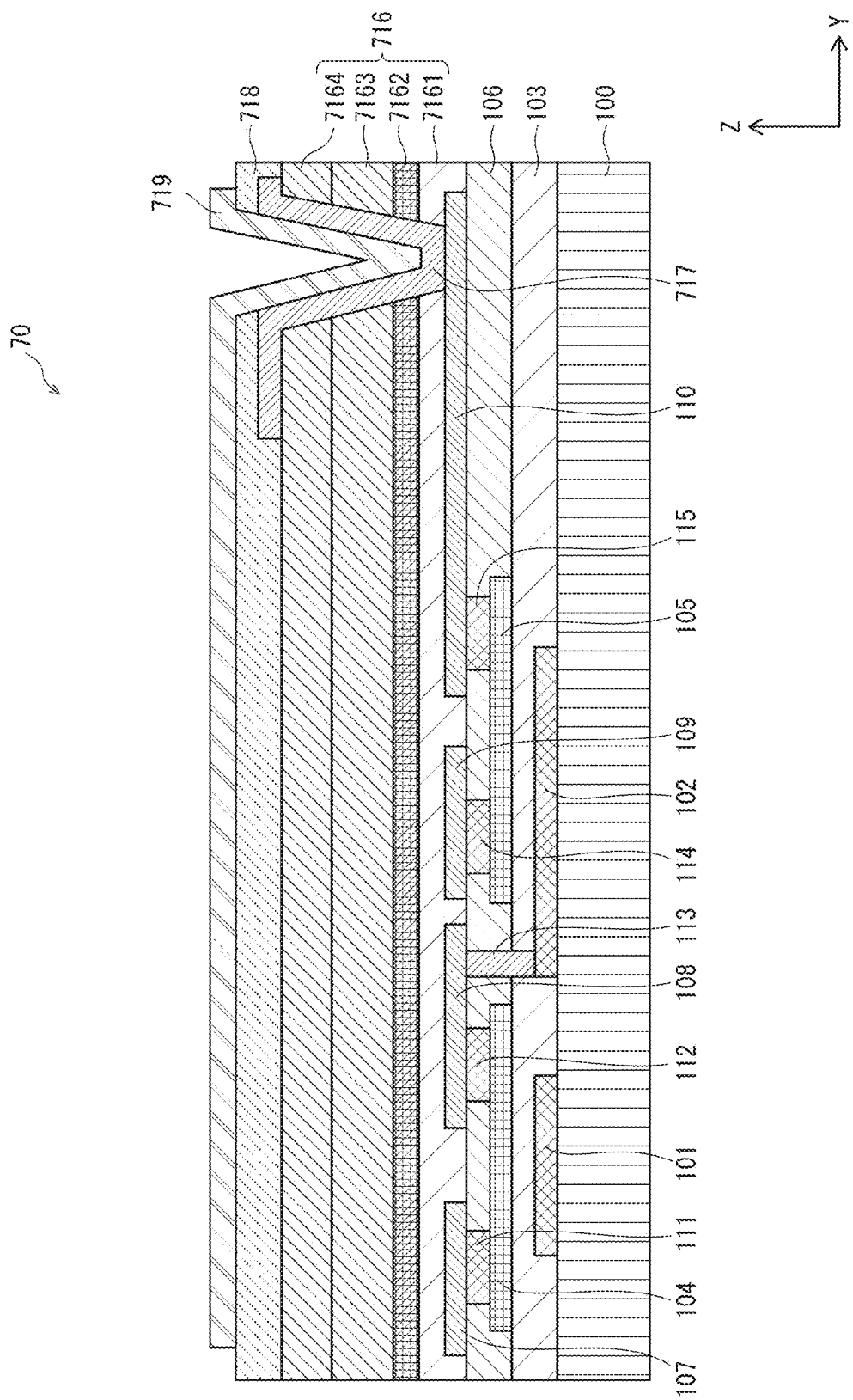

FIG. 10 is a schematic cross-sectional diagram illustrating the structure of one part of a display panel 70 pertaining to embodiment 4 of the present disclosure.

Figure 11:
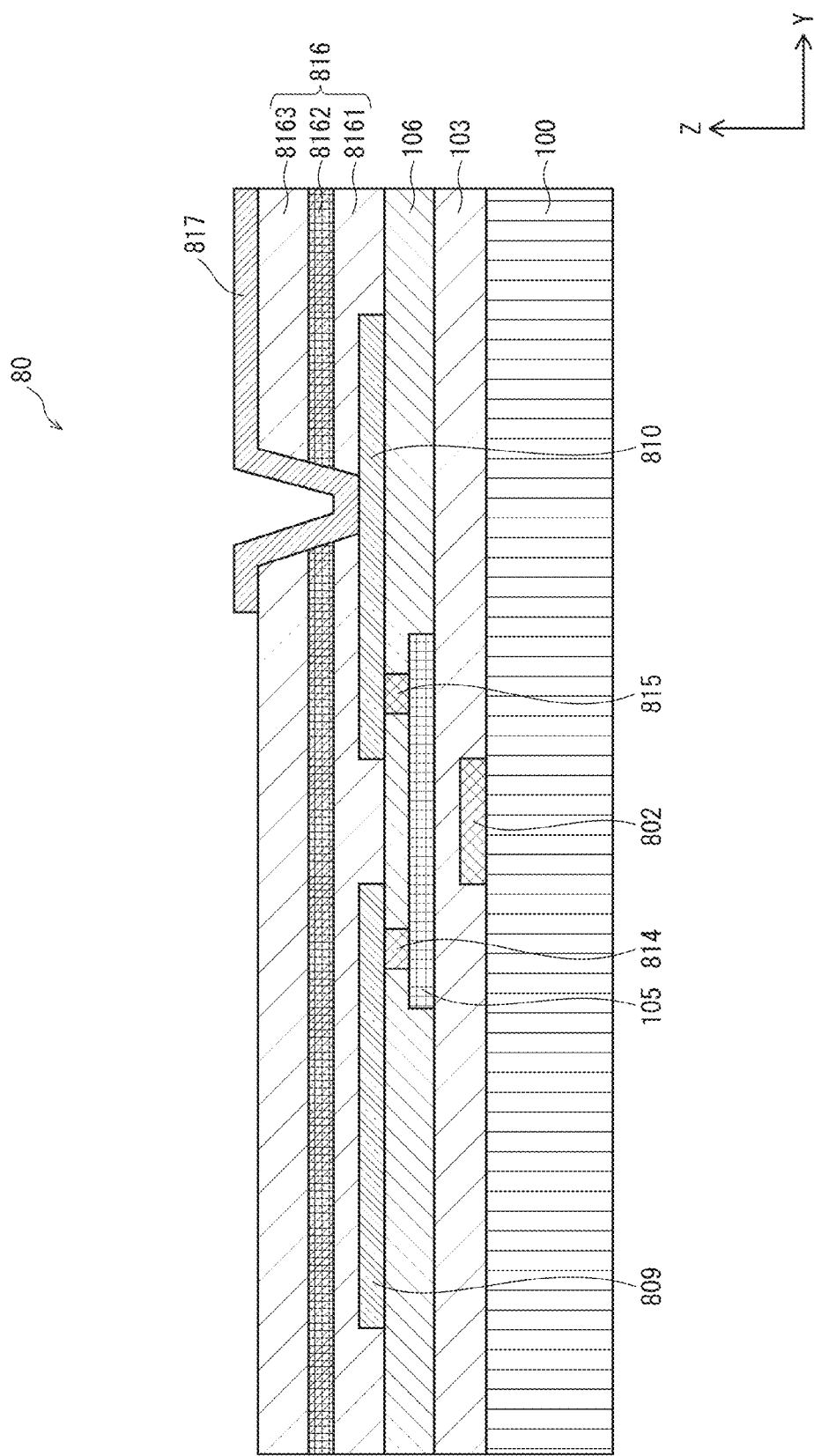

FIG. 11 is a schematic cross-sectional diagram illustrating the structure of one part of a display panel 80 pertaining to embodiment 5 of the present disclosure.

Figure 12A:
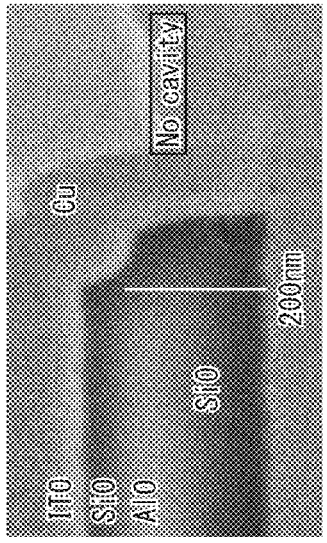
Figure 12B:
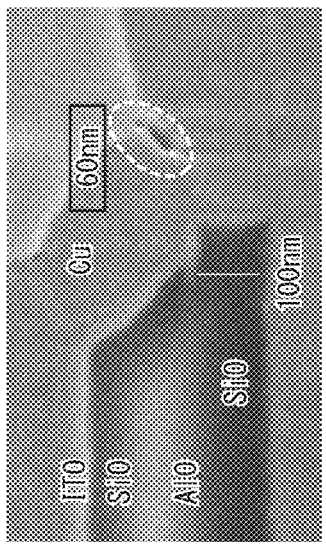
Figure 12C:
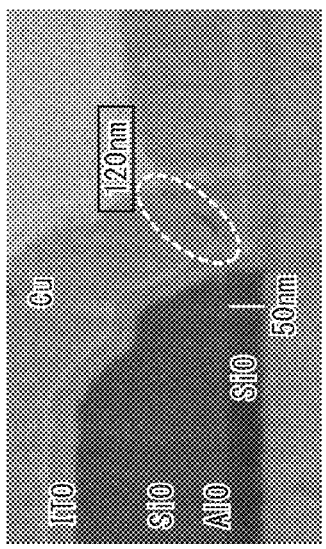

Each of FIGS. 12A through 12C is a schematic cross-sectional diagram illustrating a passivation layer and an upper electrode, with FIG. 12A illustrating a comparative example where a lower insulating layer has a thickness of 50 nm, FIG. 12B illustrating a comparative example where the lower insulating layer has a thickness of 100 nm, and FIG. 12C illustrating an implementation example where the lower insulating layer has a thickness of 200 nm.

FIG. 13A is a schematic cross-sectional diagram for explaining how a cavity is formed in the upper electrode when the lower insulating layer has a thickness smaller than desirable, and FIG. 13B is a schematic cross-sectional diagram for explaining how the forming of the cavity is suppressed when the lower insulating layer has a desirable thickness.

FIG. 14 includes four graphs each indicating how the thicknesses of a SiO layer and a SiN layer of an upper insulating layer are related to withstand voltage between SD electrodes and the upper insulating layer, with graph (a) illustrating an example where the SiO layer has a thickness of 260 nm and the SiN layer is not included, graph (b) illustrating an example where the SiO layer has a thickness of 100 nm and the SiN layer has a thickness of 100 nm, graph (c) illustrating an example where the SiO layer has a thickness of 200 nm and the SiN layer has a thickness of 100 nm, and graph (d) illustrating an example where the SiO layer has a thickness of 100 nm and the SiN layer has a thickness of 200 nm.

Figure 15:
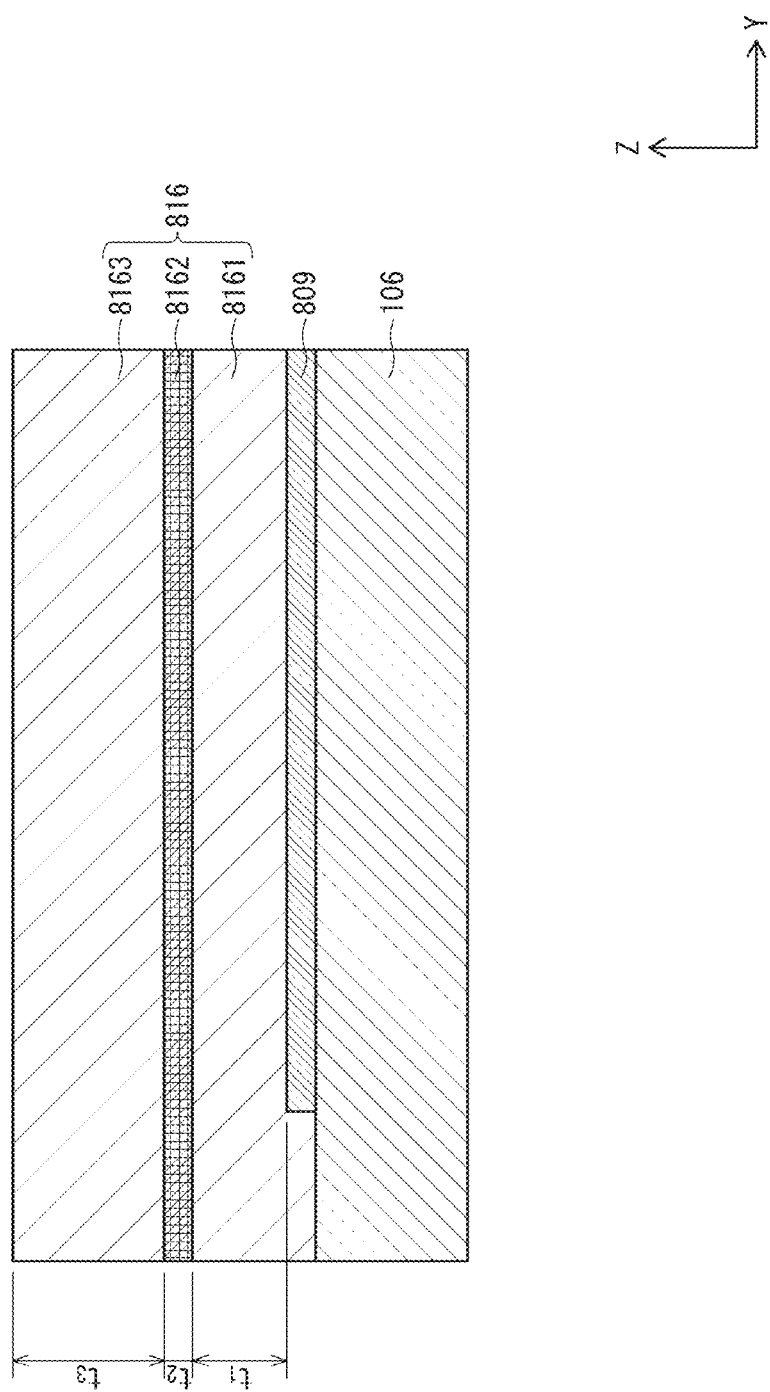

FIG. 15 is a schematic cross-sectional diagram illustrating the structure of one part of the display panel 80 including a passivation layer 816 and an area around the passivation layer 816.

FIGS. 16A and 16B are microscope photographs illustrating adhesiveness between a barrier layer and an upper insulating layer for different film-forming temperatures applied in the forming of the upper insulating layer, with FIG. 16A illustrating a case where the film-forming temperature was 230 degrees Celsius, and FIG. 16B illustrating a case where the film-forming temperature was 290 degrees Celsius.

Figure 17:
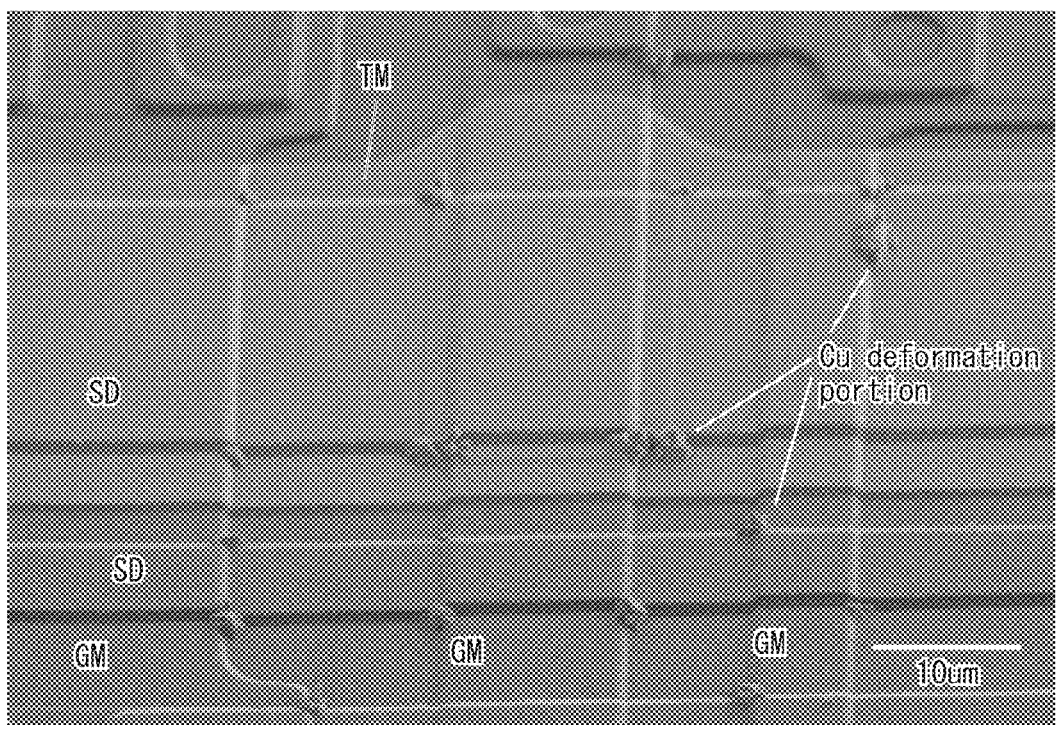

FIG. 17 is a schematic plan view illustrating SD electrodes having undergone deformation due to the film-forming temperature applied in the forming of the upper insulating layer being higher than desirable.

Each of FIGS. 18A and 18B is a schematic cross-sectional diagram illustrating how hydrogen travels to reaches the channel layer, with FIG. 18A illustrating how hydrogen travels in an ITO crystallization process, and FIG. 18B illustrating how hydrogen travels in a process of baking an interlayer insulating layer.

Figures 19A, 19B:
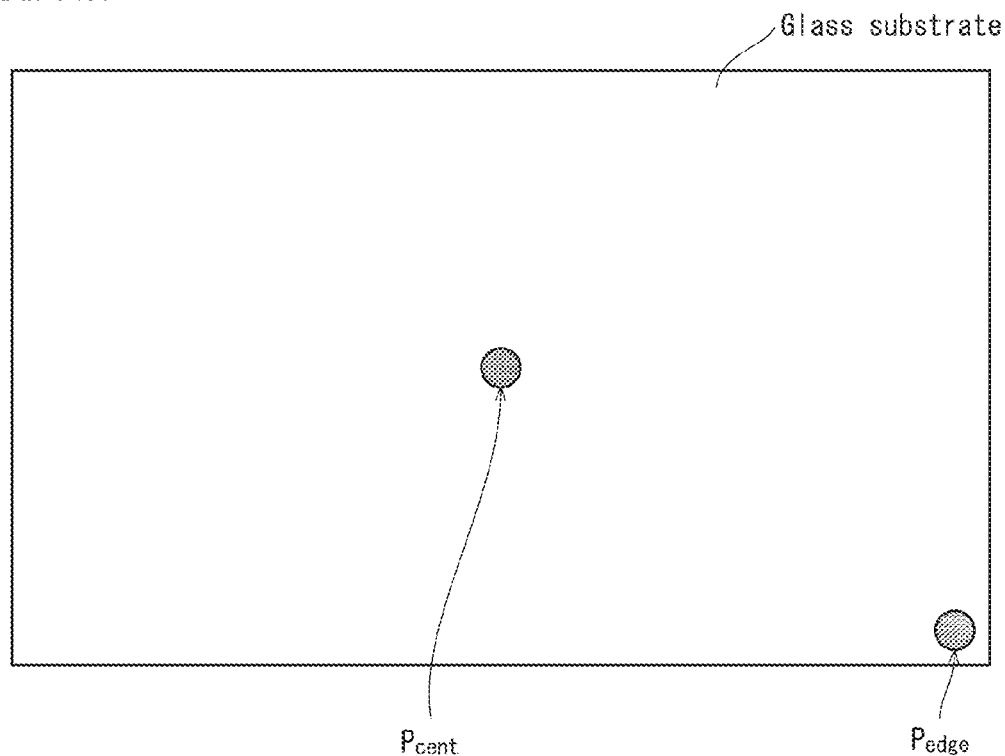

FIG. 19A is a schematic plan view illustrating a glass substrate used for determining how film-forming conditions of a SiN film are related to the characteristics of the SiN film, and measurement points on the glass substrate, and FIG. 19B shows measurement data indicating film-forming conditions and characteristics of the SiN film.

Figure 20A:
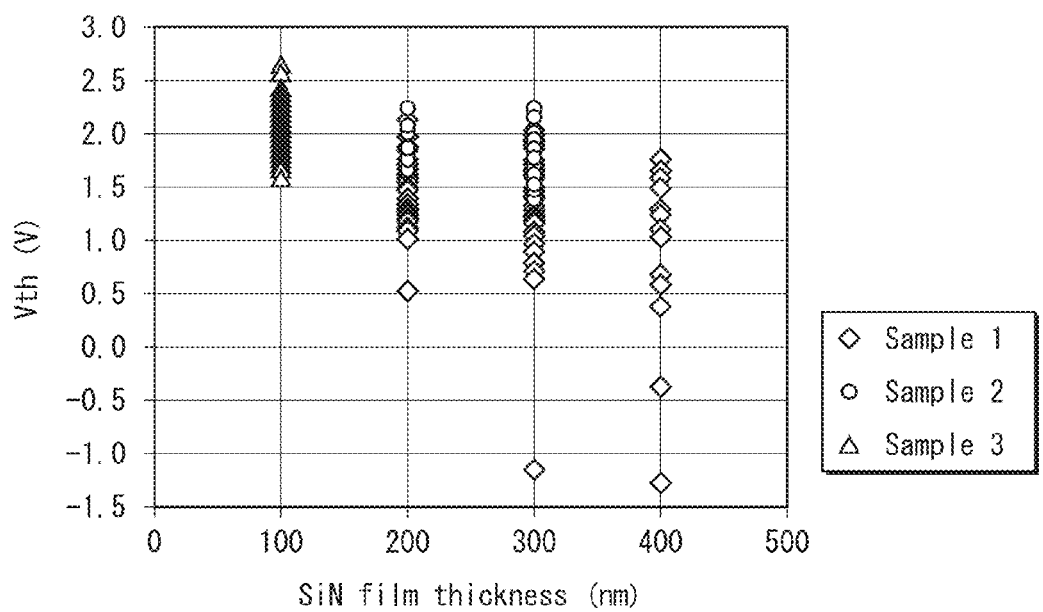
Figure 20B:
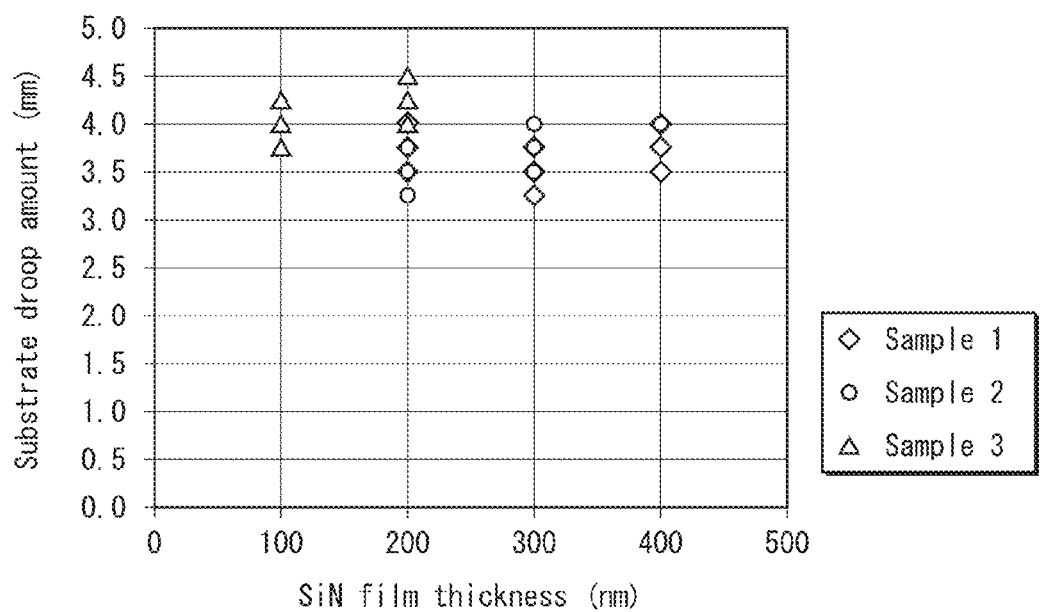

FIG. 20A is a characteristic diagram illustrating how the thicknesses of SiN films in samples 1 through 3 are related to transistor characteristics, and FIG. 20B is a characteristic diagram illustrating how the thicknesses of the SiN films in samples 1 through 3 are related to substrate droop amounts.

Figure 21:
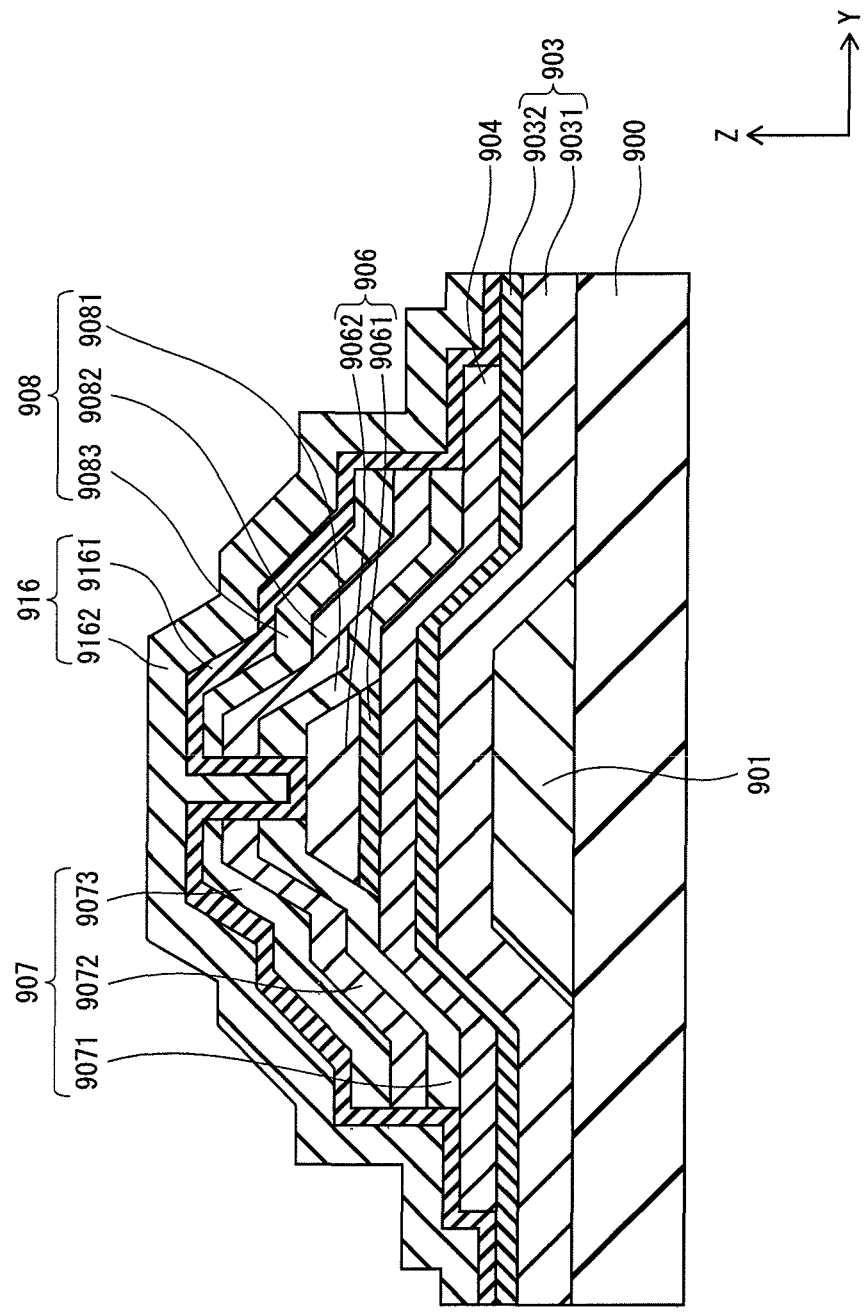

FIG. 21 is a cross-sectional diagram illustrating the structure of a conventional TFT element.

DESCRIPTION OF EMBODIMENTS

Aspects of Present Disclosure

One aspect of the present disclosure is a thin film transistor device (referred to in the following as a TFT device) including: (i) a substrate; (ii) a gate electrode; (iii) an electrode pair composed of a source electrode and a drain electrode; (iv) a channel layer; and (v) a passivation layer.

The gate electrode is above the substrate.

The channel layer is above the gate electrode.

The electrode pair is on the channel layer, and the source electrode and the drain electrode are spaced away from one another.

The passivation layer extends over the gate electrode, the channel layer, and the electrode pair, and has a hole penetrating therethrough in a thickness direction.

The channel layer is made of an oxide semiconductor. The passivation layer includes a first layer, a second layer, and a third layer layered one on top of another in this order with the first layer closest to the substrate. The first layer is made of one of silicon oxide, silicon nitride, and silicon oxynitride, the second layer is made of an Al compound, and the third layer made of one of silicon oxide, silicon nitride, and silicon oxynitride.

In the TFT device pertaining to one aspect of the present disclosure, the channel layer achieves high electron mobility due to being made of an oxide semiconductor, and thus, has excellent electric characteristics. Due to this, the TFT device pertaining to one aspect of the present disclosure achieves high electron mobility, irrespective of temperature.

In addition, the passivation layer is composed of three layers layered one on top of another (i.e., the first layer, the second layer, and the third layer), and the second layer is made of an aluminum compound. The second layer suppresses the entry of moisture and hydrogen (i.e., functions as a barrier), and protects the channel layer.

Further, in the TFT device pertaining to one aspect of the present disclosure, the passivation layer is composed of at least the three layers above. Thus, decrease in processing yield in forming the hole (contact hole) in the passivation layer is not likely to occur. That is, due to the passivation layer having such a structure, the contact hole can be formed by forming holes in the first and third layers through dry etching, and forming a hole in the second layer through wet etching. Thus, in the etching of each of the three layers, the etch selectivity with respect to the layer below can be set to a high level, and thus, it can be ensured that the etching of the layer below can be started with the etching of the present layer completed by performing over etching.

Accordingly, the TFT device pertaining to one aspect of the present disclosure achieves high manufacturing yield while suppressing the degradation of the channel layer, which is made of an oxide semiconductor.

In the TFT device pertaining to one aspect of the present disclosure, the first layer may be in contact with at least one of the gate electrode, the source electrode, and the drain electrode.

The TFT device pertaining to one aspect of the present disclosure may further include an electrically-conductive layer having a part extending along an inner wall of the passivation layer defining the hole in the passivation layer, and a part connecting to one of the gate electrode, the source electrode, and the drain electrode at a bottom of the hole in the passivation layer, and in the TFT device, the passivation layer further includes a fourth layer on the third layer, the fourth layer made of one of silicon oxide, silicon nitride, and silicon oxynitride.

In the TFT device pertaining to one aspect of the present disclosure, the third layer and the fourth layer may both be made of silicon nitride, and the fourth layer may contain silicon nitride at a lower density than the third layer. Forming third layer and the fourth layer both of silicon nitride prevents the entry of moisture to a further extent. Further, the fourth layer containing silicon nitride at a lower density than the third layer facilitates forming a hole (contact hole) with a tapered shape.

In the TFT device pertaining to one aspect of the present disclosure, at least one of the source electrode and the drain electrode may contain Cu or a Cu alloy, the fourth layer may be made of one of silicon nitride and silicon oxynitride and have a thickness of at least 200 nm, and the third layer may be made of silicon oxide and has a thickness of at least 100 nm. Defining the thicknesses of the third and fourth layers in such a manner ensures that a withstand voltage between the electrode pair and the electrode disposed on the passivation layer has a level desirable in a TFT device.

The TFT device pertaining to one aspect of the present disclosure may further include an electrically-conductive layer having a part extending along an inner wall of the passivation layer defining the hole in the passivation layer, and a part connecting to one of the gate electrode, the source electrode, and the drain electrode at a bottom of the hole in the passivation layer, and in the TFT device, the passivation layer may further include a fourth layer and a fifth layer, the fourth layer residing on the third layer and made of one of silicon oxide, silicon nitride, and silicon oxynitride, the fifth layer residing on the fourth layer and made of one of silicon oxide, silicon nitride, and silicon oxynitride, and the electrically-conductive layer may further include a part residing between the fourth layer and the fifth layer. Providing the passivation layer with the fourth and fifths layers prevents the entry of moisture to a further extent.

The TFT device pertaining to one aspect of the present disclosure may further include an interlayer insulating layer between the first layer and at least one of the gate electrode, the source electrode, and the drain electrode.

In the TFT device pertaining to one aspect of the present disclosure, the interlayer insulating layer may have a hole penetrating therethrough and overlapping with the hole in the passivation layer, and the thin film transistor device may further include an electrically-conductive layer having a part extending along an inner wall of the interlayer insulating layer defining the hole in the interlayer insulating layer, a part connecting to one of the gate electrode, the source electrode, and the drain electrode at a bottom of the hole in the interlayer insulating layer, and a part residing between the interlayer insulating layer and the first layer.

In the TFT device pertaining to one aspect of the present disclosure, the second layer may be made of AlOx. The second layer, when made of AlOx, prevents the entry of moisture and/or hydrogen (functions as a barrier), and thus excellently protects the channel layer. This suppresses degradation of the channel layer.

In the TFT device pertaining to one aspect of the present disclosure, the first layer may be made of silicon oxide.

In the TFT device pertaining to one aspect of the present disclosure, the passivation layer may have a thickness no greater than 600 nm. Providing the passivation layer with a thickness no greater than 1000 nm (or more preferably, with a thickness no greater than 600 nm) suppresses a decrease in manufacturing efficiency.

In the TFT device pertaining to one aspect of the present disclosure, at least one of the source electrode and the drain electrode may contain Cu or a Cu alloy, and the first layer may be made of silicon oxide and have a thickness of at least 200 nm. Providing the first layer with a thickness of at least 200 nm suppresses the forming of a cavity in an electrically-conductive layer (i.e., an upper electrode (electrode connected to source electrode or drain electrode) in the TFT device) having a part extending along an inner wall of the passivation layer defining the hole in the passivation layer. Thus, this ensures a high level of electrical reliability.

One aspect of the present disclosure is a display device including any of the TFT devices described above. Thus, the display device achieves the effects described above.

The display device pertaining to one aspect of the present disclosure may include a plurality of light-emitting parts disposed over and along a surface of the substrate, the light-emitting parts each including: an anode; a cathode; and an organic light-emitting layer between the anode and the cathode. As such, the TFT device pertaining to one aspect of the present disclosure is applicable to an organic EL display device.

Note that the substrate need not be made of a material such as glass, and may be a flexible substrate made of a material such as resin.

One aspect of the present disclosure is a method for manufacturing a TFT device including the following steps (i) through (iv).

(i) Forming a gate electrode above a substrate.
(ii) Forming a channel layer above the gate electrode.
(iii) Forming, on the channel layer, an electrode pair composed of a source electrode and a drain electrode that are spaced away from one another.
(iv) Forming a passivation layer extending over the gate electrode, the channel layer, and the electrode pair, having a hole penetrating therethrough in a thickness direction, and including a first layer, a second layer, and a third layer each having a part of the hole in the passivation layer formed therein.

In step (ii), the channel layer is made of an oxide semiconductor.

Step (iv) includes:
(iv-1) Forming a first layer preform made of one of silicon oxide, silicon nitride, and silicon oxynitride, the first layer preform extending over the gate electrode, the channel layer, and the electrode pair.
(iv-2) Forming a second layer preform made of an Al compound (aluminum oxide, aluminum nitride, aluminum nitride) on the first layer perform.

(iv-3) Forming a third layer preform made of one of silicon oxide, silicon nitride, and silicon oxynitride above the second layer perform.

(iv-4) Forming the third layer by performing dry etching to form a hole penetrating through the third layer preform in a thickness direction at a part of the third layer preform corresponding to the hole (contact hole) in the passivation layer.

(ix-5) Forming the second layer by performing wet etching with respect to a surface of the second layer preform exposed at a bottom of the part of the hole in the third layer to form a hole penetrating through the second layer preform in a thickness direction.

(iv-6) Forming the first layer by performing dry etching with respect to a surface of the first layer preform exposed at a bottom of the part of the hole in the second layer to form a hole penetrating through the first layer preform in a thickness direction.

In the method pertaining to one aspect of the present disclosure, the channel layer achieves high electron mobility due to being made of an oxide semiconductor in step (ii), and thus, has excellent electric characteristics. Due to this, the method pertaining to one aspect of the present disclosure achieves manufacturing a TFT device having high electron mobility, irrespective of temperature.

In addition, the passivation layer is formed to be composed of three layers layered one on top of another (i.e., the first layer, the second layer, and the third layer) through steps (iv-1) through (iv-6), and the second layer is made of an aluminum compound. The second layer suppresses the entry of moisture and hydrogen (i.e., functions as a barrier), and protects the channel layer.

Further, in the method pertaining to one aspect of the present disclosure, the holes in the first and third layers are formed through dry etching, and the hole in the second layer is formed through wet etching (steps (iv-4) through (iv-6)). Thus, in the etching of each of the three layers, the etch selectivity with respect to the layer below can be set to a high level, and thus, it can be ensured that the etching of the layer below can be started with the etching of the present layer completed by performing over etching.

Accordingly, the method pertaining to one aspect of the present disclosure achieves high manufacturing yield while suppressing the degradation of the channel layer, which is made of an oxide semiconductor.

The method pertaining to one aspect of the present disclosure may further include performing annealing in a dry air atmosphere or an oxygen atmosphere, and in the method, the first layer preform may be formed through plasma chemical vapor deposition (CVD) or sputtering, and the annealing may be performed immediately after forming the first layer perform (step (iv-1)). In the forming of the first layer preform, the substrate with the channel layer formed thereon is placed in a vacuum. Thus, an oxygen defect in the oxide semiconductor of the channel layer occurs, which brings about a decrease in resistance of the channel layer.

In view of this, the method pertaining to one aspect of the present invention ensures that the channel layer has high resistance, by performing annealing in a dry air atmosphere or an oxygen atmosphere immediately after forming the first layer preform.

In the method pertaining to one aspect of the present disclosure, the second layer preform may be made of AlOx.

In the method pertaining to one aspect of the present disclosure, the second layer preform may be formed in step (iv-2) to have a thickness within a range of 10 nm to 100 nm, inclusive. A thickness smaller than 10 nm of the second layer perform may result in the function of the second layer of preventing the entry of moisture and/or hydrogen being lower than desirable, whereas a thickness greater than 100 nm of the second layer perform may result in longer processing time and a consequent decrease in manufacturing efficiency.

In the method pertaining to one aspect of the present disclosure, the passivation layer may be formed to have a thickness no greater than 1000 nm, or more preferably, a thickness no greater than 600 nm, through step (iv). Providing the passivation layer with a thickness no greater than 1000 nm, or more preferably, a thickness no greater than 600 nm, achieves forming a passivation layer whose barrier function is at an excellent level with high manufacturing efficiency.

The method pertaining to one aspect of the present disclosure may further include, performing annealing under a temperature no higher than 300 degrees Celsius, after forming the third layer perform, and in step (iii) of the method, at least one of the source electrode and the drain electrode is formed to contain Cu or a Cu alloy. This ensures the high resistance of the channel layer, and further, suppresses the deformation of at least one of the source electrode and the drain electrode, which are formed by using Cu material.

In step (iv-1) of the method pertaining to one aspect of the present disclosure, the first layer preform may be made of silicon oxide and may be formed under a temperature no higher than 230 degrees Celsius. Forming the first layer perform under such low temperature prevents surface roughening in lower layers (electrode and wiring) made of Cu material, and achieves high adhesiveness between the first layer and such lower layers and ensures excellent contact characteristics between electrodes.

In step (iv-1) of the method pertaining to one aspect of the present disclosure, the first layer preform may be formed by using a mixture of $SiH_4$ gas and $N_2O$ gas, the mixture not diluted with Ar gas, and $SiH_4$ gas may be introduced at a flow amount satisfying: $SiH_4/(SiH_4+N_2O)<1.1\%$. Limiting the flow amount of $SiH_4$ gas in such a manner reduces damage to the channel layer caused by hydrogen (H) during the forming of the first layer.

Further, by not diluting the gas mixture with Ar gas, damage to the channel layer by Ar is also prevented.

In step (iv-1) of the method pertaining to one aspect of the present disclosure, the first layer preform may be formed to have a thickness of at least 200 nm. Forming the first layer perform to have a thickness of at least 200 nm suppresses the forming of a cavity in an electrically-conductive layer (i.e., an upper electrode (electrode connected to source electrode or drain electrode) in the TFT device) having a part extending along an inner wall of the passivation layer defining the hole in the passivation layer. Thus, this is advantageous for ensuring a high level of electrical reliability.

In step (iv-1) of the method pertaining to one aspect of the present disclosure, the first layer preform may be formed to have a thickness no greater than 600 nm. While providing the first layer perform with a thickness greater than 600 nm may be advantageous in order to reduce the influence that fixed charge generated in the second layer has on the channel layer, providing the first layer perform with a thickness greater than 600 nm results in an increase in the amount of time required for etching, etc. Thus, providing the first layer perform with a thickness no greater than 600 nm is advantageous for suppressing an increase in takt time and reducing manufacturing cost.

The method pertaining to one aspect of the present disclosure may further include: (ix-7) forming a fourth film preform that is made of silicon oxide, after forming the second layer preform (ix-2) and before forming the third layer perform (iv-3), and in the method, the fourth film preform may be in contact with both the second layer preform and the third layer preform, and in step (iv-3), the third layer preform may be formed to be made of silicon nitride or silicon oxynitride, in step (iv-7), the fourth film preform may be formed to have a thickness of at least 100 nm, and, in step (iv-3), the third layer preform may be formed to have a thickness of at least 200 nm. Forming the third and fourth layers with such thicknesses ensures that a withstand voltage between the electrode pair and the electrode disposed on the passivation layer has a level practically desirable in a TFT device.

In steps (iv-3) and (iv-7) of the method pertaining to one aspect of the present disclosure, the third layer preform and the fourth film preform may be formed under a temperature equal to or higher than 290 degrees Celsius and lower than 300 degrees Celsius. Forming the third layer preform and the fourth film preform under such a temperature ensures high adhesiveness between the electrode pair and the passivation layer, and in addition, suppresses the occurrence of upward separation of the passivation layer and the like at areas such as near the contact hole. In addition, film forming under such a temperature suppresses migration occurring in at least one of the source electrode and the drain electrode, at least one of which containing Cu material, and thus suppresses the deformation of such electrodes. Thus, the forming of an electrical short circuit between the electrode pair and electrode and electrodes/wiring formed on the passivation layer is prevented.

In step (iv-3) of the method pertaining to one aspect of the present disclosure, the third layer preform may be formed to be made of silicon nitride satisfying SiH/NH≤0.10. This suppresses damage (reduction) to the channel layer by hydrogen (H) separating from the silicon nitride, and thus, ensures excellent electrical characteristics.

In step (iv-3) of the method pertaining to one aspect of the present disclosure, the third layer preform may be formed to be made of silicon nitride and when formed, to have a stress within a range of ±150 MPa, inclusive. This suppresses deformation of the substrate (substrate warping), and thus, ensures high productivity even when using an existent production facility with a roller conveyer.

Embodiment 1

1. Overall Structure of Display Device 1

Figure 1:
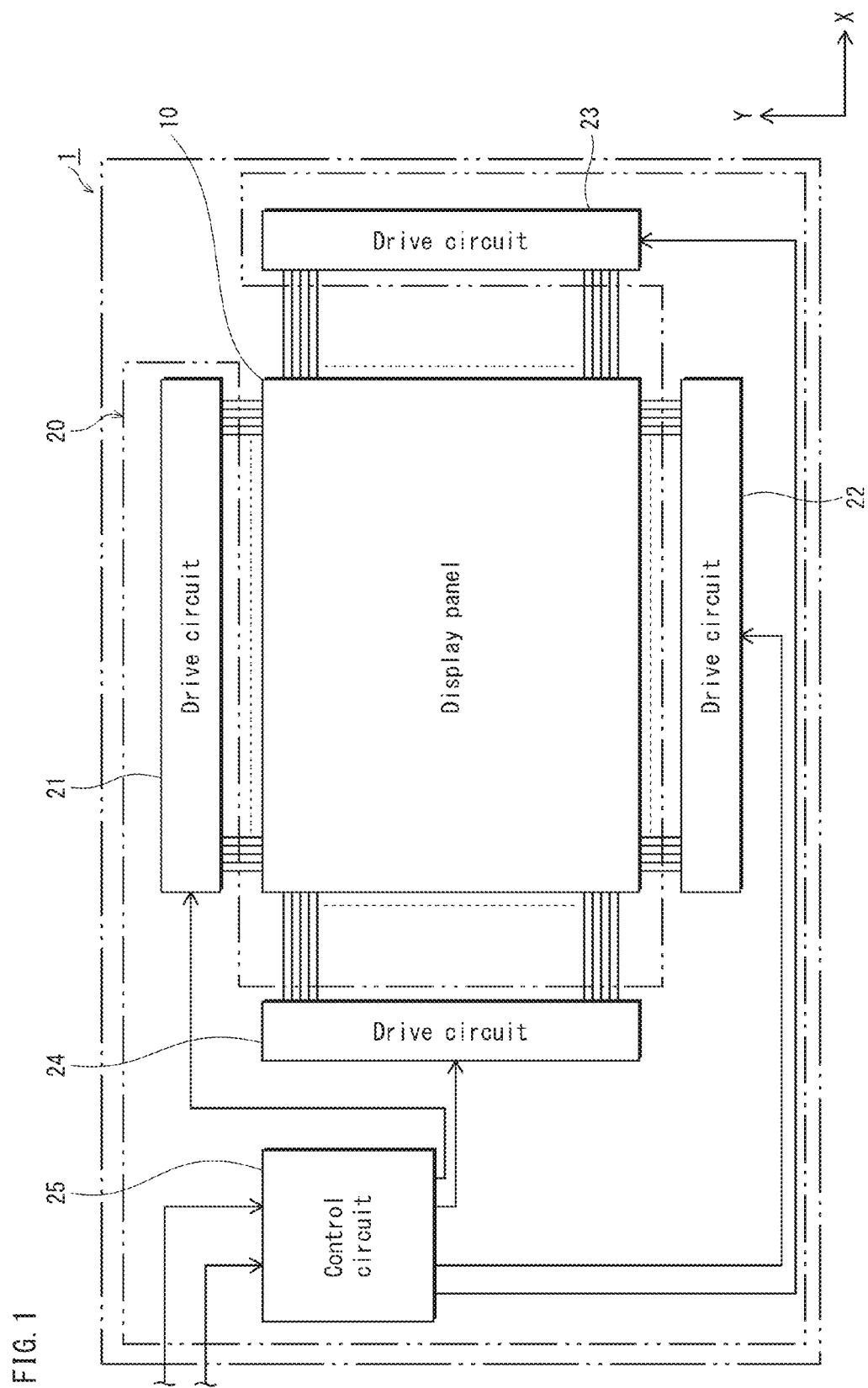
FIG. 1 is a schematic block diagram illustrating the structure of a display device 1 pertaining to embodiment 1 of the present disclosure.

The following describes the overall structure of a display device 1 pertaining to embodiment 1 of the present disclosure, with reference to FIG. 1.

As illustrated in FIG. 1, the display device 1 includes a display panel 10, and a drive/control circuit 20 connected to the display panel 10.

The display panel 10 is an organic electro-luminescent (EL) panel utilizing an electric-field light-emitting phenomenon related to organic material. The display panel 10 includes a plurality of organic EL elements, and for example, the organic EL elements form a matrix. The drive/control circuit 20 includes four drive circuits, namely drive circuits 21, 22, 23, 24 and a control circuit 25.

Note that in the display device 1, the arrangement of the circuits of the drive/control circuit 20 may differ from what is illustrated in FIG. 1.

2. Circuit Configuration of Display Panel 10

Figure 2:
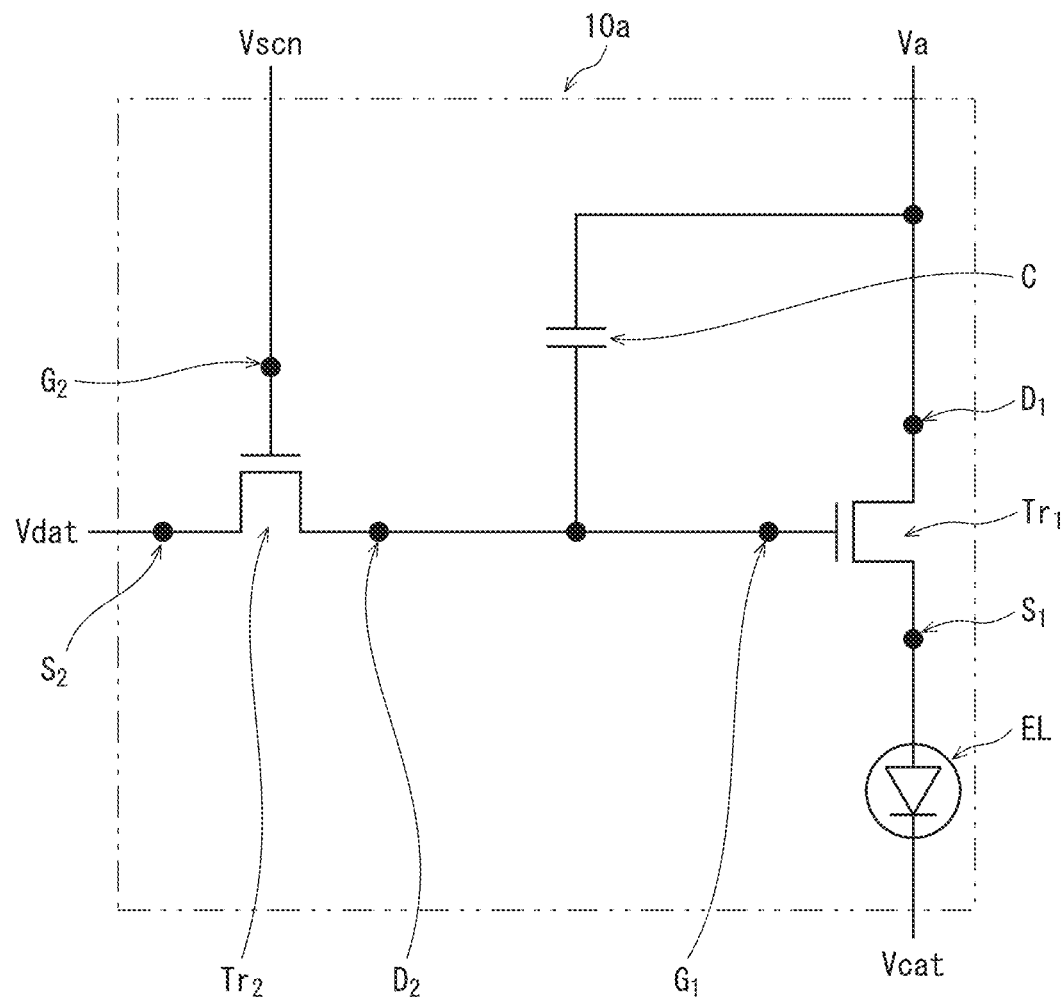
FIG. 2 is a schematic circuit diagram illustrating the circuit configuration of each subpixel 10a of a display panel 10.

The following describes the circuit configuration of each of a plurality of sub-pixels 10a of the display panel 10, with reference to FIG. 2.

As illustrated in FIG. 2, each subpixel 10a in the display panel 10 includes one capacitor C, an EL element part EL that emits light, and two transistor elements, namely transistor elements $Tr_1$, $Tr_2$. The transistor element $Tr_1$ is a driving transistor element, and the transistor element $Tr_2$ is a switching transistor element.

The switching transistor element $Tr_2$ includes a gate electrode $G_2$, a source electrode $S_2$, and a drain electrode $D_2$. The gate electrode $G_2$ is connected to a scan line Vscn. The source electrode $S_2$ is connected to a data line Vdat. The drain electrode $D_2$ is connected to a gate electrode $G_1$ of the driving transistor element $Tr_1$.

The driving transistor element includes, in addition to the gate electrode $G_1$, a drain electrode $D_1$ and a source electrode $S_1$. The drain electrode $D_1$ is connected to a power line Va. The source electrode $S_1$ is connected to an anode of the EL element part EL. Meanwhile, the EL element part EL has a cathode that is connected to a ground line Vcat.

The capacitor C connects each of the drain electrode $D_2$ of the switching transistor element $Tr_2$ and the gate electrode $G_1$ of the driving transistor element $Tr_1$ to the power line Va.

In the display panel 10, the sub-pixels 10a, each having the circuit configuration illustrated in FIG. 2, form a matrix, for example. For example, a set of a plurality of sub-pixels 10a adjacent to one another (for example, a set of three adjacent subpixels 10a each corresponding to one of the light-emission colors red (r), green (G), and blue (B)) forms a pixel of the display panel 10.

3. Structure of Display Panel 10

The following describes the structure of the display panel 10, with reference to the schematic cross-sectional view in FIG. 3.

The display panel 10 is a top-emission-type organic EL display panel. The display panel 10 includes a TFT device part and an EL element part. The TFT device part is arranged lower in the Z axis direction, and the EL element part is disposed on the TFT device part.

(1) TFT Device Part

As illustrated in FIG. 3, above a substrate 100, gate electrodes 101 and 102 are disposed spaced from one another. A gate insulating layer 103 is disposed to cover surfaces of the gate electrodes 101 and 102 and a surface of the substrate 100. Channel layers 104 and 105 are disposed on the gate insulating layer 103. The channel layers 104 and 105 respectively correspond to the gate electrodes 101 and 102. A channel protection layer 106 is disposed to cover surfaces of the channel layers 104 and 105 and a surface of the gate insulating layer 103.

A source electrode 107 and a drain electrode 108 are disposed spaced from one another on the channel protection layer 106. The source electrode 107 and the drain electrode 108 correspond to the gate electrode 101 and the channel layer 104. Similarly, a source electrode 110 and a drain electrode 109 are disposed spaced from one another on the channel protection layer 106. The source electrode 110 and the drain electrode 109 correspond to the gate electrode 102 and the channel layer 105.

Under the source electrodes 107 and 110, source lower electrodes 111 and 116 are respectively disposed. The source lower electrodes 111 and 116 penetrate through the channel protection layer 106. Similarly, under the drain electrodes 108 and 109, drain lower electrodes 112 and 114 are respectively disposed. The drain lower electrodes 112 and 114 also penetrate through the channel protection layer 106. Z-axis direction bottom portions of the source lower electrode 111 and the drain lower electrode 112 are in contact with the channel layer 104. Similarly, Z-axis direction bottom portions of the source lower electrode 114 and the drain lower electrode 115 are in contact with the channel layer 105.

Further, the drain electrode 108 and the gate electrode 102 are connected via a contact plug 113. The contact plug 113 penetrates through the gate insulating layer 103 and the channel protection layer 106.

The gate electrode 101 corresponds to the gate electrode $G_2$ in FIG. 2, the source electrode 107 corresponds to the source electrode $S_2$ in FIG. 2, and the drain electrode 108 corresponds to the drain electrode $D_2$ in FIG. 2. Similarly, the gate electrode 102 corresponds to the gate electrode $G_1$ in FIG. 2, the source electrode 110 corresponds to the source electrode $S_1$ in FIG. 2, and the drain electrode 109 corresponds to the drain electrode $D_1$ in FIG. 2. Thus, FIG. 3 illustrates the switching transistor element $Tr_2$ in the left side thereof in the Y-axis direction, and illustrates the driving transistor element $Tr_1$ in the right side thereof in the Y-axis direction. However, the switching transistor element $Tr_1$ and the driving transistor element $Tr_2$ need not be arranged as illustrated in FIG. 3.

A passivation layer 116 is disposed to cover the source electrodes 107 and 110, the drain electrodes 108 and 109, and the channel protection layer 106. The passivation layer 116 has a contact hole formed therein above the source electrode 110. An upper electrode 117 is disposed to cover an inner wall of the passivation layer 116 defining the contact hole.

A Z-axis direction bottom portion of the upper electrode 117 is connected to the source electrode 110. A part of a Z-axis direction top portion of the upper electrode 117 resides on the passivation layer 116.

An interlayer insulating layer 118 is deposited on the passivation layer 116.

(2) EL Element Part

An anode 119 is disposed on the interlayer insulating layer 116. The anode 119 corresponds to one subpixel 10a. The anode 119 is connected to the upper electrode 117, at the bottom of a contact hole formed in the interlayer insulating layer 118 above the upper electrode 117.

A hole injection layer 120 is formed on the anode 119. Further, banks 121 are formed on the anode 119. The banks 121 each cover one edge of the hole injection layer 120. The banks 121 define an opening that corresponds to one subpixel 10a.

A hole transport layer 122, a light-emitting layer 123, and an electron transport layer 124 are disposed in this order with the hole transport layer 122 lowermost in the Z axis direction, inside the opening defined by the banks 121. A Z-axis direction bottom portion of the hole transport layer 122 is in contact with the hole injection layer 120.

A cathode 125 and a sealing layer 126 are disposed in this order one on top of another to cover the electron transport layer 124 and the banks 121. The cathode 125 extends continuously over the entire display panel 10. The cathode 125 is connected to bus bar wirings each corresponding to one pixel or a group of a few pixels (not illustrated in FIG. 3).

An adhesion layer 127 disposed on the sealing layer 126 in the Z axis direction adheres the sealing layer 126 to a color filter layer 128 and light blocking layers 129. The color filter layer 128 and the light-blocking layers 129 are formed on a main surface (Z-axis direction bottom surface) of a substrate 130.

(3) Materials of Constituent Elements

The following provides examples of material usable for the constituent elements illustrated in FIG. 3.

(i) Substrates 100, 130

Each of the substrates 100, 130 may be, for example: a glass substrate; a quartz substrate; a silicon substrate; a metal substrate made of a metal such as molybdenum sulfide, copper, zinc, aluminum, stainless steel, magnesium, iron, nickel, gold, or silver; a semiconductor substrate made of a semiconductor such as gallium arsenide; or a plastic substrate.

When implementing at least one of the substrates 100, 130 by using a plastic substrate, the resin of the plastic substrate may either be thermoplastic resin or thermosetting resin. Examples of such resins include polyolefins, such as polyethylene, polypropylene, ethylene-propylene copolymers, and ethylene-vinyl acetate copolymers (EVA), cyclic polyolefin, modified polyolefins, polyvinyl chloride, polyvinylidene chloride: polystyrene, polyamide, polyimide (PI), polyamide-imide, polyesters, such as polycarbonate, poly (4-methylpentene-1), ionomers, acrylic-based resins, polymethyl methacrylater acrylic-styrene copolymers (AS resins), butadiene-styrene copolymers, ethylene vinyl alcohol copolymers (EVOH), polyethylene terephthalate (PET), polybutylene terephthalate, polyethylene naphthalate (PEN), and polycyclohexane terephthalate (PCT), polyether, polyether ketone, polyethersulfone (PES), polyether imide, polyacetal, polyphenylene oxide, modified polyphenylene oxide, polyarylate, aromatic polyesters (liquid crystal polymer), polytetrafluoroethylene, polyvinylidene fluoride, other fluorocarbon resins, thermoplastic elastomers, such as styrene-based elastomers, polyolefin-based elastomers, polyvinyl chloride-based elastomers, polyurethane-based elastomers, fluorocarbon rubbers, and chlorinated polyethylene-based elastomers, epoxy resins, phenolic resins, urea resins, melamine resins, unsaturated polyesters, silicone resins, and polyurethane, and copolymers, blends, and polymer alloys thereof. The plastic substrate may be composed of two or more layers of one of such materials or two or more of such materials.

(ii) Gate Electrode 101, 102

Each of the gate electrodes 101, 102 is, for example, composed of a copper layer having a thickness of 200 nm and a molybdenum layer having a thickness of 20 nm. However, the gate electrodes 101, 102 need not have such a structure, and each may be made of only copper or a combination of copper and tungsten. Alternatively, the gate electrodes 101, 102 may each be made of the following materials.

Examples of other material usable for the gate electrodes 101, 102 include: metals, such as chromium, aluminum, tantalum, niobium, silver, gold, platinum, palladium, indium, nickel, and neodymium, and alloys thereof; conductive metal oxides, such as zinc oxide, tin oxide, indium oxide, and gallium oxide; conductive metal complex oxides, such as indium tin complex oxide (ITO), indium zinc complex oxide (IZO), aluminum zinc complex oxide (AZO), and gallium zinc complex oxide (GZO); conductive polymers, such as polyaniline, polypyrrole, polythiophene, and polyacetylene, and conductive polymers doped with acids, e.g., hydrochloric acid, sulfuric acid, and sulfonic acid, Lewis acids, e.g., phosphorus pentafluoride, arsenic pentafluoride, and iron chloride, halogen elements, e.g., iodine, and metals, e.g., sodium and potassium; and conductive composite materials containing carbon black and metal particles dispersed. Alternatively, polymer mixtures containing electrically-conductive particles, such as fine metal particles or graphite, may be used. These materials may be used alone or in combination.

(iii) Gate Insulating Layer 103

The gate insulating layer 103 is, for example, a combination of a silicon oxide layer having a thickness of 80 nm and a silicon nitride layer having a thickness of 70 nm. However, the gate insulating layer 103 need not have such a structure, and for example, may be made of any known organic material or inorganic having electrically-insulative properties.

Examples of such organic materials include acrylic resins, phenolic resins, fluororesins, epoxy resins, imide resins, and novolac type resins.

Examples of such inorganic materials include: metal oxides, such as silicon oxide, aluminum oxide, tantalum oxide, zirconium oxide, cerium oxide, zinc oxide, and cobalt oxide; metal nitrides, such as silicon nitride, aluminum nitride, zirconium nitride, cerium nitride, zinc nitride, cobalt nitride, titanium nitride, and tantalum nitride; and metal complex oxides, such as barium strontium titanate and lead zirconate titanate. These may be used alone or in combination.

Further, one or more surfaces of the gate insulating layer 103 may be processed by using a surface treatment agent (ODTS OTS HMDS βPTS) or the like.

(iv) Channel Layers 104, 105

Each of the channel layers 104, 105 is made of amorphous indium gallium zinc oxide (IGZO) and has a thickness of 50 nm. However, the channels layer 104, 105 need not be made of amorphous IGZO. That is, it suffices for the channel layers 104, 105 to be made of an oxide semiconductor including at least one of indium, gallium, and zinc.

Further, the channel layers 104, 105 may have any thickness within the range of 20 nm to 200 nm. Further, the channel layers 104 and 105 may have different thicknesses.

(v) Channel Protection Layer 106

The channel protection layer 106 is made of silicon oxide and has a thickness of 130 nm. However, the channel protection layer 106 need not be made of silicon oxide. That is, for example, the channel protection layer 106 may be made of silicon oxynitride, silicon nitride, or aluminum oxide. Further, the channel protection layer may be a combination of two or more layers each made of such material.

Further, the channel protection layer 106 may have any thickness within the range of 50 nm and 500 nm.

(vi) Source Electrodes 107, 110 and Drain Electrodes 108, 109

The source and drain electrodes (source electrodes 107, 110 and drain electrodes 108, 109) are each a combination of a copper-manganese layer having a thickness of 20 nm, a copper layer having a thickness of 300 nm, and a molybdenum layer having a thickness of 20 nm.

The source and drain electrodes may each have any thickness within the range of 100 nm to 500 nm.

Further, the source lower electrodes 111, 115 and the drain lower electrodes 112, 114 may be made of the same materials as those used for the source and drain electrodes (source electrodes 107, 110 and drain electrodes 108, 109). Further, the source electrode 107 and the source lower electrode 111 may be formed as one, the drain electrode 108 and the drain lower electrode 112 may be formed as one, the drain electrode 109 and the drain lower electrode 114 may be formed as one, and the source electrode 110 and the source lower electrode 115 may be formed as one.

(vii) Passivation Layer 116

In the display panel 10, the passivation layer 116 is composed of a lower insulating layer 1161, a barrier layer 1162, and an upper insulating layer 1162 disposed in this order one on top of another, with the lower insulating layer 1161 lowermost in the Z axis direction.

The lower insulating layer 1161 is made of silicon oxide and has a thickness of 100 nm.

The barrier layer 1162 is made of aluminum oxide and has a thickness of 25 nm.

The upper insulating layer 1163 is made of silicon nitride and has a thickness of 360 nm.

As illustrated in FIG. 3, the barrier layer 1162 is sandwiched between the lower insulating layer 1161 and the upper insulating layer 1163. The lower insulating layer 1161 is in contact with the source electrodes 111, 115 and the drain electrodes 112, 114.

It is preferable that the lower insulating layer 1161, which is made of silicon oxide, have high adhesiveness with respect to the source electrodes 107, 110 and the drain electrodes 108, 109, whose materials are described above. Further, it is preferable that the lower insulating layer 1161 have low hydrogen content, if any.

The barrier layer 1162 prevents the entry of moisture and/or hydrogen, and thereby suppresses degradation of the channel layers 104, 105, which are made of an oxide semiconductor (IGZO or the like). To achieve this function, it is preferable that the barrier layer 1162 have a density of at least 2.80 g/cm$^3$. With a density lower than 2.80 g/cm$^3$, the function of the barrier layer 1162 of preventing the entry of moisture and/or hydrogen would decrease rapidly, which would bring about a prominent degradation (i.e., a decrease in sheet resistance) of the channel layers 104, 105.

In addition, it is preferable that the barrier layer 1162 have a density no greater than 3.25 g/cm$^3$. With a density greater than 3.25 g/cm$^3$, the etching rate when wet etching is performed with respect to the barrier layer 1162 would become extremely low. (Note that the wet etching is for forming the hole for the upper electrode 117 in the barrier layer 1162.) Thus, in view of manufacturing efficiency, it is preferable that the barrier layer 1162 have a density no greater than 3.25 g/cm$^3$.

Materials other than those described above may be used for the lower insulating layer 1161. Examples of such material include silicon nitride and silicon oxynitride. Similarly, materials other than those described above may be used for the upper insulating layer 1163. Examples of such material include silicon oxide and silicon oxynitride.

In addition, the passivation layer 116 may have any thickness within the range of 200 nm to 1000 nm. It is preferable that the passivation layer 116 have a thickness no greater than 600 nm.

(viii) Upper Electrode 117

The upper electrode 117 is a combination of a copper layer having a thickness of 300 nm and an indium tin oxide layer having a thickness of 70 nm. However, other materials are usable for the upper electrode 117, as long as a material having electrical conductivity is selected.

(ix) Interlayer Insulating Layer 118

The interlayer insulating layer 118 is made of, for instance, an organic compound such as polyimide, polyamide, or acrylic resin material.

(x) Anode 119

The anode 119 is made of a metal material containing silver or aluminum. Further, in a top-emission type display panel such as the display panel 10, it is preferable that the anode 119 have a highly-reflective surface portion.

Further, the anode 119 need not be composed of a single layer of the metal materials described above. That is, the anode 119 may be a combination of a metal layer and a light-transmissive electrically-conductive layer. Examples of material usable for such a light-transmissive electrically-conductive layer include indium tin oxide and indium zinc oxide.

(xi) Hole Injection Layer 120

The hole injection layer 120 is made of, for instance, an oxide of a metal such as silver (Ag), molybdenum (Mo), chromium (Cr), vanadium (V), tungsten (W), nickel (Ni), or iridium (Ir), or an electrically-conductive polymer material such as PEDOT (an amalgam of polythiophene and polystyrene sulfonic acid). In FIG. 3, the display panel 10 is illustrated to include a hole injection layer 120 made of a metal oxide. When made of a metal oxide, the hole injection layer 120 is capable of assisting hole generation and injecting holes into the light-emitting layer 123 with a higher level of stability, compared to when the hole injection layer 120 is made of an electrically-conductive polymer material such as PEDOT. As such, the hole injection layer 120, when made of a metal oxide, has a higher work function than the hole injection layer 120, when made of an electrically-conductive polymer material.

When the hole injection layer 120 is made of an oxide of a transition metal, the hole injection layer 120 has a plurality of energy levels due to having a plurality of oxidation numbers. This makes hole injection easy and allows for reduction of driving voltage. It is particularly preferable to form the hole injection layer 120 by using tungsten oxide ($WO_x$), since the hole injection layer 120 can be provided with the function of stably injecting holes and assisting the generation of holes.

(xii) Banks 121

The banks 121 are made of an organic material such as resin and have electrically-insulative properties. Examples of organic material usable for forming the banks 121 include acrylic resins, polyimide resins, and novolac type phenolic resin. In addition, it is desirable that the banks 121 have resistance against organic solvents. Further, since the banks 121 may undergo processes such as etching, baking, etc., when being formed, it is desirable that the banks 121 be formed by using highly resistant material that will not change excessively in shape or quality during such processes. In addition, to provide the banks 121 with liquid repellency, the surfaces thereof can be fluoridated.

This is since, if a liquid-philic material is used to form the banks 121, the difference in liquid philicity/liquid repellency between the surfaces of the banks 121 and the surface of the light-emitting layer 123 becomes smaller than desirable, and it thus becomes difficult to keep ink containing an organic substance for forming the light-emitting layer 123 to be selectively held within the opening defined by the banks 121.

In addition, the banks 121 need not have a single-layer structure as shown in FIG. 3. That is, the banks 121 may be alternatively composed of two or more layers. In such a case, the above materials may be combined for each layer, or the layers may alternate between inorganic and organic material.

(xiii) Hole Transport Layer 122

The hole transport layer 122 is formed by using a high-molecular compound not containing a hydrophilic group. For instance, the hole transport layer 122 may be made of a high-molecular compound, such as polyfluorene or a polyfluorene derivative or polyallylamine or a polyallylamine derivative, but not containing a hydrophilic group.

(xiv) Light-Emitting Layer 123

The light-emitting layer 123 has a function of emitting light when an excitation state is produced by the recombination of holes and electrons injected thereto. It is desirable that material used to form the light-emitting layer 123 be a light emitting-organic material, a film of which can be formed by wet printing.

Specifically, it is desirable that the light-emitting layer 123 be made of a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as disclosed in Japanese Patent Application Publication No. H5-163488.

(xv) Electron Transport Layer 124

The electron transport layer 124 has a function of transporting, to the light-emitting layer 123, electrons injected thereto from the cathode 125. The electron transport layer 124 is made of, for instance, an oxadiazole derivative (OXD), a triazole derivative (TAZ), a phenanthroline derivative (BCP, Bphen), or the like.

(xvi) Cathode 125

The cathode 125 is made of, for instance, indium tin oxide (ITO), indium zinc oxide (IZO), or the like. Further, in a top-emission type display panel such as the display panel 10, it is desirable that the cathode 125 be made of light-transmissive material. When the cathode 125 is made of light-transmissive material, it is desirable that the cathode 125 have light-transmissivity of 80% or greater.

(xvii) Sealing Layer 126

The sealing layer 126 has a function of preventing organic layers such as the light-emitting layer 123 from being exposed to moisture and/or air, and is made of, for example, a material such as silicon nitride (SiN) or silicon oxynitride (SiON). In addition, the sealing layer 126 may further include a sealing resin layer made of a resin material such as acrylic resin or silicone resin disposed on the layer made of material such as silicon nitride (SiN) or silicon oxynitride (SiON).

Further, in a top-emission type display panel such as the display panel 10, it is desirable that the sealing layer 126 be made of light-transmissive material.

4. Method of Manufacturing Display Panel 10

The following describes a method of manufacturing the display panel 10, with reference to FIGS. 4A through 4D, FIGS. 5A through 5D, FIG. 6A through 6C, and FIGS. 7A through 7C.

(1) Forming of Gate Electrodes 101, 102

Figure 4A:
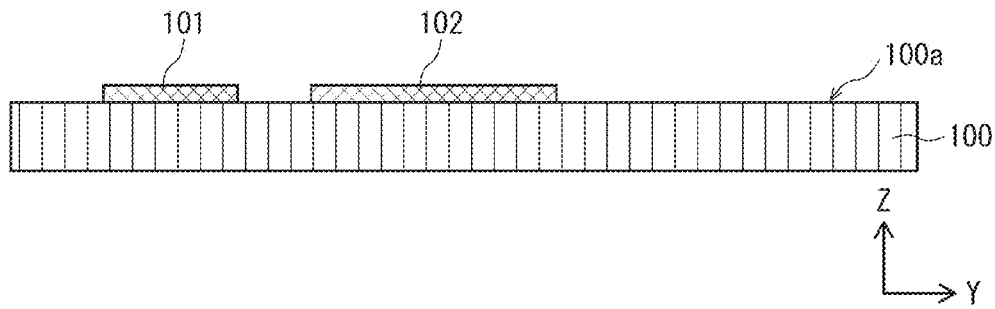

As illustrated in FIG. 4A, the gate electrodes 101, 102 are formed spaced from another, on a Z-axis direction upper surface 100a of the substrate 100. The gate electrodes 101, 102 are formed, for example, as specifically discussed in the following.

First, a metal thin film made of Cu and a metal thin film made of Mo are formed in this order one on top of another on the surface 100a, through metal sputtering. Then, a resist pattern is formed above the metal thin films through photolithography.

After subsequently performing wet-etching, the resist pattern is removed. This completes the forming of the gate electrodes 101, 102.

(2) Forming of Gate Insulating Layer 1030 and Channel Layers 104, 105

Figure 4B:
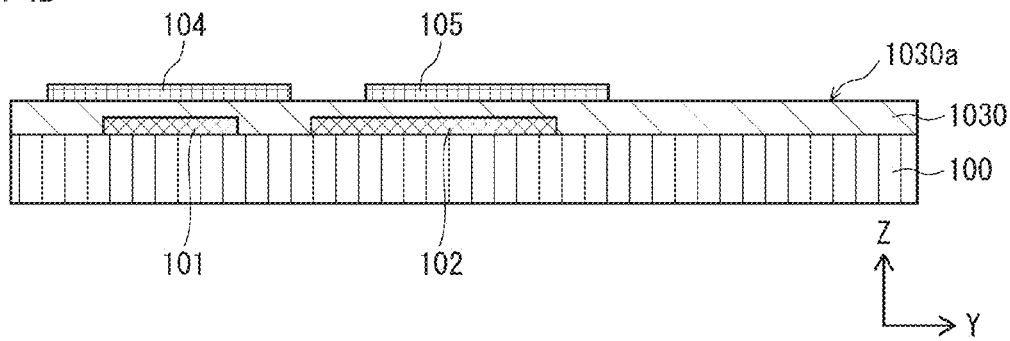

As illustrated in FIG. 4B, a gate insulating layer 1030 is formed to cover the surfaces of the gate electrodes 101, 102 and the surface of the substrate 100. Further, channel layers 104, 105 are formed spaced from one another on a surface 1030a of the gate insulating layer 1030.

The gate insulating layer 1030 is formed, for example, by forming a SiO layer and a SiN layer in this order one on top of another through plasma chemical vapor deposition (CVD) or sputtering. The gate insulating layer 1030 is formed for example, under a temperature within the range of 300 to 400 degrees Celsius.

The channel layers 104, 105 are formed by forming an oxide semiconductor layer through sputtering, and then patterning the oxide semiconductor layer so formed through photolithography and wet-etching.

(3) Forming of Channel Protection Layer 1060

Figure 4C:
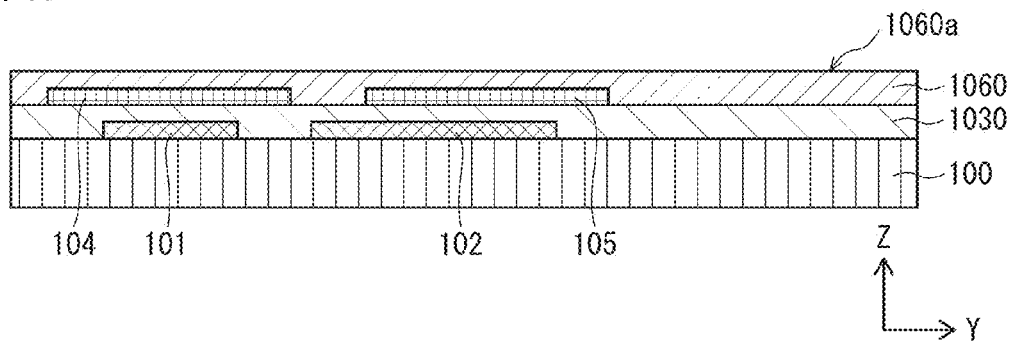

As illustrated in FIG. 4C, a channel protection layer 1060 is formed to cover the surfaces of the channel layers 104, 105, and the surface 1030a of the gate insulating layer 1030.

The channel protection layer 1060 is formed by forming a SiO layer through plasma CVD or sputtering, and subsequently performing annealing under a temperature no lower than the temperature under which the SiO layer is formed, in a dry-air atmosphere or an oxygen atmosphere. The channel protection layer 1060 is to be formed under a temperature no higher than 300 degrees Celsius.

The annealing is for repairing the oxygen defect in the channel layers 104, 105 and thereby maintaining the semiconductor characteristics of the channel layers 104, 105.

(4) Forming of Source Electrodes 107, 110 and Drain Electrodes 108, 109

Figure 4D:
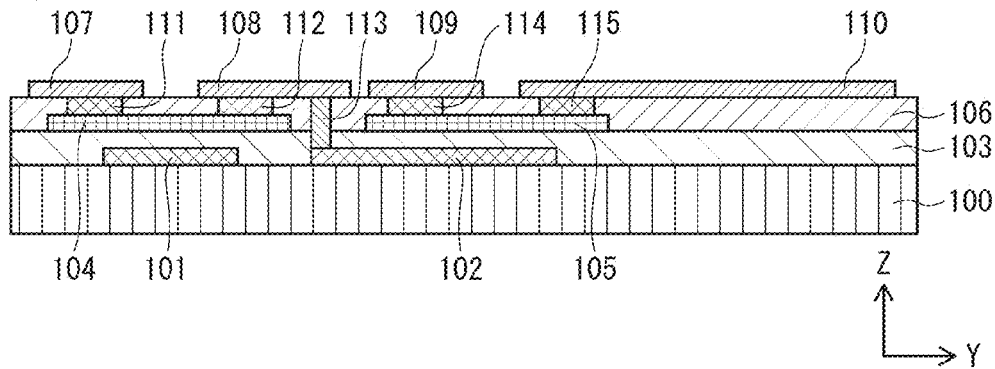

As illustrated in FIGS. 4C and 4D, the source electrodes 107, 110 and the drain electrodes 108, 109 are formed on the surface 1060a of the channel protection layer 1060. Further, forming is executed of the source lower electrodes 111 and 115, respectively corresponding to the source electrodes 107 and 110, the drain lower electrodes 112 and 114, respectively corresponding to the drain electrodes 108 and 109, and the contact plug 113.

In specific, first, contact holes are formed in predetermined parts of the channel protection layer 1060. The contact holes are formed by first forming a pattern through photolithography, and then performing dry-etching.

Subsequently, a CuMn thin film, a Cu thin film, and a Mo thin film are formed in this order one on top of another. Then, the source electrodes 107, 110 and the drain electrodes 108, 109 are formed by patterning, through photolithography and wet-etching.

Note that the forming of the source lower electrodes 111 and 115, the drain lower electrodes 112 and 114, and the contact plug 113 in the channel protection layer 106 may be performed before forming the metal thin films, or may be performed at the same time as forming the metal thin films.

(5) Forming of Lower Insulating Layer 11610, Barrier Layer 11620, and Upper Insulating Layer 11630

Figure 5A:
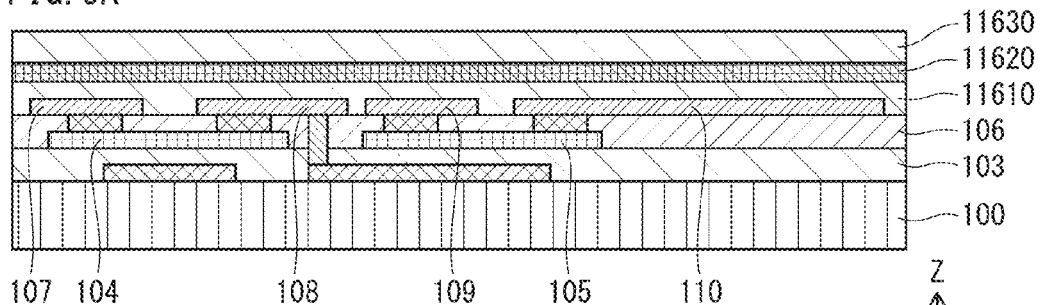

As illustrated in FIG. 5A, a lower insulating layer 11610, a barrier layer 11620, and an upper insulating layer 11630 are formed in this order one on top of another, to cover the source electrodes 107 and 108, the drain electrodes 108 and 109, and the channel protection layer 106.

The lower insulating layer 11610 is formed by first forming a film through plasma CVD or sputtering, and then performing annealing in a dry air or oxygen atmosphere. Here, note that due to the channel layer 104, 105 being placed in a vacuum during the forming of the lower insulating layer 11610, an oxygen defect occurs in the channel layers 104, 105, which reduces the resistance of the channel layers 104, 105. However, the annealing performed subsequent to the forming of the lower insulating layer 11610 repairs the oxygen defect and provides the channel layers 104, 105 with the desired level of resistance.

The barrier layer 11620 is formed by forming a film through CVD, ALD (atomic layer deposition), or sputtering. It is preferable that the barrier layer 11620 be formed to have a thickness of 100 nm or smaller. This is due to a greater thickness of the barrier layer 11620 results in an increase in the amount of time required for later processing.

The upper insulating layer 11630 is formed through plasma CVD or sputtering.

(6) Forming of Contact Hole 116a in Passivation Layer 116

Figure 5B:
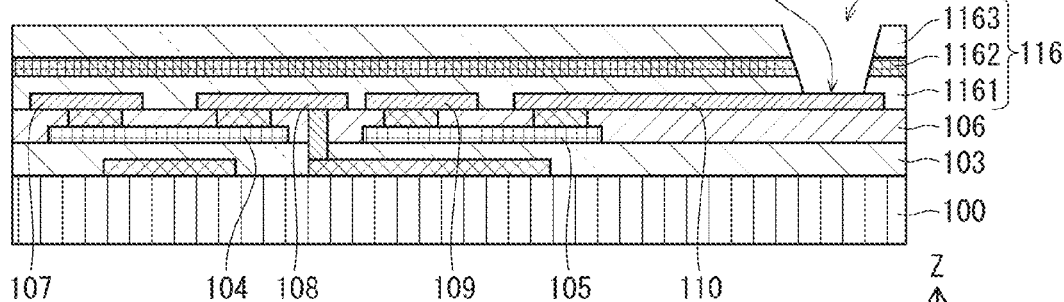

As illustrated in FIG. 5B, a contact hole 116a is formed in a part of the passivation layer 116 above the source electrode 110. The contact hole 116a is formed to expose at the bottom thereof a surface 110a of the source electrode 110. The forming of the contract hole 116a is performed as follows.

First, as illustrated in FIG. 7A, a hole 1163a is formed in the upper insulating layer 1163 through dry etching. The hole 1163a exposes at the bottom thereof a surface 11620a of the barrier layer 11620. The dry etching is performed, for example, under the following conditions.

$CF_4/O_2 = 1080/120$ sccm

Pressure=30 mTorr

ICP/Bias=3000/3000 W

Subsequently, as illustrated in FIG. 7B, a hole 1162a is formed in the barrier layer 1162 through wet etching. The hole 1162a exposes at the bottom thereof a surface 11610a of the lower insulating layer 11610. The wet etching is performed by using a PAN (phosphoric-acetic-nitric) etchant.

Subsequently, as illustrated in FIG. 7C, a hole is formed in the lower insulating layer 1161 through dry etching, with which the forming of the contact hole 116a is completed. As already discussed above, the contact hole 116a exposes at the bottom thereof the surface 110a of the source electrode 110. The dry etching for forming the hole in the lower insulating layer 1161 is performed, for example, under the following conditions.

$CF_4/O_2=1080/120$ sccm

Pressure=30 Pa

ICP/Bias=3000/3000 W

Thus, the contact hole 116a is formed in the passivation layer 116.

(7) Forming of Upper Electrode 117 and Interlayer Insulating Layer 118

Figure 5C:
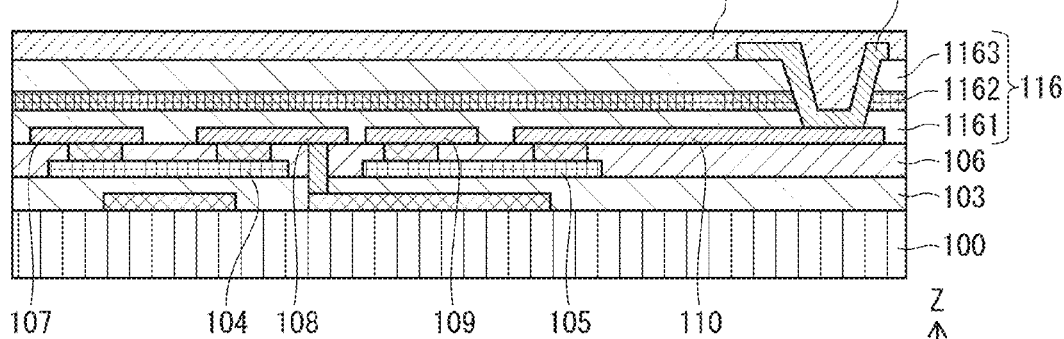

As illustrated in FIG. 5C, the upper electrode 117 is formed to extend along an inner wall of the passivation layer 116 defining the contact hole 116a, which has been formed in the passivation layer 116. A part of a top portion of the upper electrode 117 resides on the upper insulating layer 1163. Subsequently, the interlayer insulating layer 1180 is formed to cover the upper electrode 117 and the passivation layer 116.

The upper electrode 117 is formed through sputtering. In specific, the upper electrode 117 is formed by first forming a metal film, and then performing patterning through photolithography and wet etching.

The interlayer insulating layer 1180 is formed by depositing a layer of the organic material discussed above through application of the organic material, and then planarizing the surface of the layer so formed.

(8) Forming of Anode 119

Figure 5D:
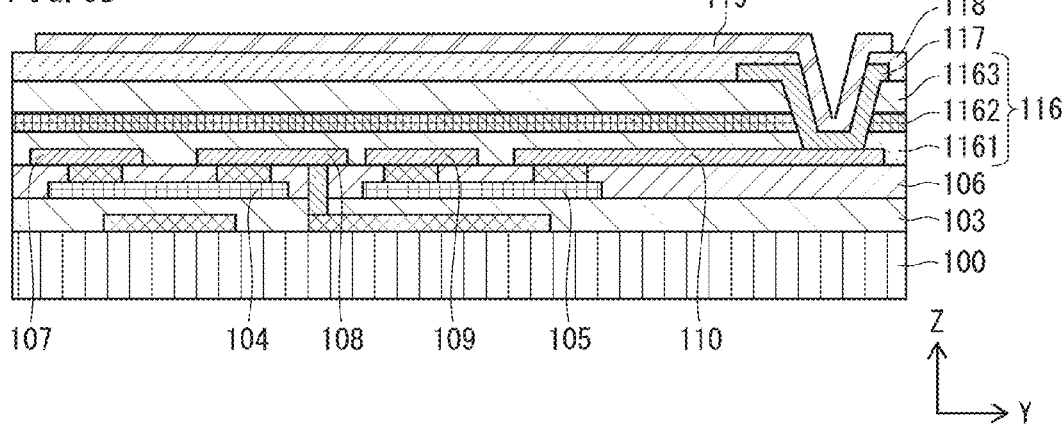

As illustrated in FIG. 5D, the anode 119 is formed by first forming a contact hole in a part of the interlayer insulating layer 1180 above the upper electrode 117.

The forming of the anode 119 is performed by first forming a metal film through sputtering, vapor deposition, or the like, and then performing patterning through photolithography and etching. Formed in such a manner, the anode 119 is electrically connected to the upper electrode 117.

(9) Forming of Hole Injection Layer 120 and Banks 121

As illustrated in FIG. 6A, the hole injection layer 120 is formed on the anode 119, and then, the banks 121 are formed to cover respective edges of the hole injection layer 120. The banks 121 are formed to define an opening 121a, which corresponds to one subpixel, and such that the opening 121a exposes a surface 120a of the hole injection layer 120 at the bottom thereof.

The hole injection layer 120 is formed by first forming a film made of a metal oxide (e.g., tungsten oxide) through sputtering, and then patterning the film into units each corresponding to one subpixel through photolithography and etching.

The banks 121 are formed by forming a film made of bank material (e.g., photosensitive resist material) on the hole injection layer 120 through spin-coating or the like, and then forming the opening 121a by patterning the bank material film so formed. The opening 121a is formed by disposing a mask on the bank material film, exposing the bank material film to light from above the mask, and performing developing.

(10) Forming of Hole Transport Layer 122, Light-Emission Layer 123, and Electron Transport Layer 124

As illustrated in FIG. 6B, in the opening 121a defined by the banks 121, the hole transport layer 122, the light-emission layer 123, and the electron transport layer 124 are formed in this order one on top of another with the hole transport layer 124 closest to the hole injection layer 120.

The hole transport layer 122 is formed by depositing a layer of ink containing hole transport layer material inside of the opening 121a through a printing method, and then performing baking. Similarly, the light-emission layer 123 is formed by depositing a layer of ink containing light-emission layer material on the hole transport layer 122 through a printing method, and then performing baking.

(11) Forming of Cathode 125 and Sealing Layer 126

As illustrated in FIGS. 6B and 6C, the cathode 125 and the sealing layer 126 are formed in this order one on top of another, to cover the electron transport layer 124 and a top part of the banks 121.

The cathode 125 and the sealing layer 126 may be formed through sputtering or the like.

Subsequently, forming of the display panel 10 is completed by disposing the substrate 130, which has the color filter layer 1128 and the like formed thereon, on top of the preform composed of the layers discussed above, with the adhesion layer 127 arranged therebetween.

5. Effects

In the TFT device part in the display panel 10 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, in the TFT device part in the display panel 10, the passivation layer 116 is composed of the lower insulating layer 1161 (first layer), the barrier layer 1162 (second layer), and the upper insulating layer 1163 (third layer). Among the three layers, the barrier layer 1162 is made of aluminum oxide. Thus, the barrier layer 1162 suppresses the entry of moisture and hydrogen (i.e., functions as a barrier), and protects (suppresses degradation of) the channel layers 104 and 105, which are made of IGZO.

Further, in the TFT device part in the display panel 10, the passivation layer 116 is at least composed of the lower insulating layer 1161, the barrier layer 1162, and the upper insulating layer 1163, with the lower insulating layer 1161 and the upper insulating layer 1163 sandwiching the barrier layer 1162. Thus, decrease in processing yield in forming the contact hole 116a in the passivation layer 116 is not likely to occur. That is, due to the passivation layer 116 having such a structure, the contact hole 116a can be formed by forming holes in the lower insulating layer 1161 and the upper insulating layer 1163 through dry etching, and forming a hole in the barrier layer 1162 through wet etching (refer to FIGS. 7A through 7C). Thus, in the etching of each of the layers 1161 through 1163, the etch selectivity with respect to the layer below can be set to a high level, and thus, it can be ensured that the etching of the layer below can be started with the etching of the present layer completed by performing over etching.

Accordingly, the configuration pertaining to embodiment 1 achieves high manufacturing yield while suppressing the degradation of the channel layers 104 and 105, which are made of IGZO.

Embodiment 2

The following describes a display panel 30 pertaining to embodiment 2, with reference to FIG. 8. Note that FIG. 8 only provides structural illustration of some parts of the display panel 30. Parts of the display panel 30 not illustrated in FIG. 8 have the same structures as the corresponding parts of the display panel 10 pertaining to embodiment 1, and are provided with the same reference signs as those provided to the corresponding parts of the display panel 10.

As illustrated in FIG. 8, the display panel 30 includes an interlayer insulating layer 331 covering the source electrodes 107 and 110, the drain electrodes 108 and 109, and the channel protection layer 106, and a passivation layer 316 disposed on the interlayer insulating layer 331. Further, the display panel 30 includes an upper electrode 317. The upper electrode 317 extends along an inner wall of the interlayer insulating layer 331 defining a contact hole formed in the interlayer insulating layer 331 and is connected to the source electrode 110. Further, a part of a top portion of the upper electrode 317 is sandwiched between the interlayer insulating layer 331 and the passivation layer 316.

In embodiment 2, the passivation layer 316 is composed of a lower insulating layer 3161, a barrier layer 3162, and an upper insulating layer 3163 disposed in this order with the lower insulating layer 3161 lowermost in the Z axis direction. The barrier layer 3162 is made of an aluminum compound (e.g., aluminum oxide). In addition, each of the lower insulating layer 3161 and the upper insulating layer 3163 is made of silicon oxide, silicon nitride, or silicon oxynitride.

Further, an anode 319 is disposed above the passivation layer 316, with an interlayer insulating layer 318 residing between the anode 319 and the passivation 316 at certain areas. The anode 319 is electrically connected to the upper electrode 317 at the bottom of a contact hole penetrating through the interlayer insulating layer 318 and the passivation layer 316.

Similar to the above, in the TFT device part in the display panel 30 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, similar to the above, in the TFT device part in the display panel 30, the passivation layer 316 includes the barrier layer 3162, which is made of an aluminum compound (e.g., AlOx). The barrier layer 3162 suppresses the entry of moisture and hydrogen (i.e., functions as a barrier), and protects (suppresses degradation of) the channel layers 104 and 105, which are made of IGZO.

Further, in the TFT device part in the display panel 30, the passivation layer 316 has a layered structure similar to the above. Thus, decrease in processing yield in forming a contact hole in the passivation layer 316 is not likely to occur.

Accordingly, the configuration pertaining to embodiment 2 achieves high manufacturing yield while suppressing the degradation of the channel layers 104 and 105, which are made of IGZO.

Embodiment 3

The following describes a display panel 50 pertaining to embodiment 3, with reference to FIG. 9. Note that FIG. 9 only provides structural illustration of some parts of the display panel 50. Parts of the display panel 50 not illustrated in FIG. 9 have the same structures as the corresponding parts of the display panel 10 pertaining to embodiment 1, and are provided with the same reference signs as those provided to the corresponding parts of the display panel 10.

As illustrated in FIG. 9, the display panel 50 pertaining to the present embodiment includes a passivation layer 516 covering the source electrodes 107 and 110, the drain electrodes 108 and 109, and the channel protection layer 106. The passivation layer 516 is composed of five layers. In specific, the passivation layer 516 is composed of: a lower insulating layer 5161 made of SiO; a barrier layer 5162 made of an aluminum compound (e.g., AlOx); a first upper insulating layer 5163 made of SiO; a second upper insulating layer 5164 made of SiN; and a third upper insulating layer 5165 made of SiN, layered in this order with the lower insulating layer 5161 lowermost in the Z axis direction.

Further, the display panel 50 includes an upper electrode 517 extending along inner walls of the lower insulating layer 5161, the barrier layer 5162, the first upper insulating layer 5163, and the second upper insulating layer 5164 defining a contact hole penetrating through the lower insulating layer 5161, the barrier layer 5162, the first upper insulating layer 5163, and the second upper insulating layer 5164. Further, a part of a top portion of the upper electrode 517 is sandwiched between the second upper insulating layer 5164 and the third upper insulating layer 5165.

Further, an anode 519 is formed above the passivation layer 516, with an interlayer insulating layer 518 therebetween at certain areas. The anode 519 is electrically connected to the upper electrode 517, at the bottom of a contact hole penetrating through the interlayer insulating layer 518 and the third upper insulating layer 5165.

The TFT device part pertaining to the present embodiment achieves the same effects as the TFT device parts in embodiments 1 and 2. In addition, the TFT device part pertaining to the present embodiment prevents the entry of moisture to a higher extent than the TFT device parts pertaining to embodiments 1 and 2, owing to the third upper insulating layer 5165 made of SiN being disposed on the upper electrode 517.

Embodiment 4

The following describes a display panel 70 pertaining to embodiment 4, with reference to FIG. 10. Note that FIG. 10 only provides structural illustration of some parts of the display panel 70. Parts of the display panel 70 not illustrated in FIG. 10 have the same structures as the corresponding parts of the display panel 10 pertaining to embodiment 1, and are provided with the same reference signs as those provided to the corresponding parts of the display panel 10.

As illustrated in FIG. 10, the display panel 70 pertaining to the present embodiment includes a passivation layer 716 covering the source electrodes 107 and 110, the drain electrodes 108 and 109, and the channel protection layer 106. The passivation layer 716 is composed of four layers. In specific, the passivation layer 716 is composed of: a lower insulating layer 7161 made of SiO; a barrier layer 7162 made of an aluminum compound (e.g., AlOx); a first upper insulating layer 7163 made of SiN; and a second upper insulating layer 7164 made of SiN, layered in this order with the lower insulating layer 7161 lowermost in the Z axis direction.

Further, in the TFT device part pertaining to the present embodiment, the second upper insulating layer 7164 has lower density than the first upper insulating layer 7163. This facilitates forming a contact hole with a tapered shape.

Further, the display panel 70 includes an upper electrode 717 extending along inner walls of the lower insulating layer 7161, the barrier layer 7162, and the first upper insulating layer 7163, defining a contact hole penetrating through the lower insulating layer 7161, the barrier layer 7162, and the first upper insulating layer 7163. Further, a part of a top portion of the upper electrode 717 is sandwiched between the second upper insulating layer 7164 and an interlayer insulating layer 718.

Further, an anode 719 is disposed above the passivation layer 716, with the interlayer insulating layer 718 therebetween at certain areas. Electrical connection similar to the above is formed between the anode 719 and the upper electrode 717.

The TFT device part pertaining to the present embodiment achieves the same effects as the TFT device parts in embodiments 1 through 3.

Embodiment 5

1. Structure

The following describes a display panel 80 pertaining to embodiment 5, with reference to FIG. 11. Note that FIG. 11 only provides structural illustration of some parts of the display panel 80. Parts of the display panel 80 not illustrated in FIG. 11 have the same structures as the corresponding parts of the display panel 10 pertaining to embodiment 1, and are provided with the same reference signs as those provided to the corresponding parts of the display panel 10.

The display panel 80, as illustrated in FIG. 11, includes electrodes 802, 809, 810, 814, 815, and 817, which are each made of a material differing from the material used for forming a corresponding electrode in embodiments 1 through 4. In specific, the gate electrode 802 is composed of an Mo layer and a Cu layer, layered in this order one on top of another, with the Mo layer closer to the substrate 100 (i.e., lower in the Z axis direction).

Each of the source electrode 810, the drain electrode 809, the source lower electrode 815, and the drain lower electrode 814 is composed of: a Mo layer; a Cu layer; and a CuMn layer, layered in this order one on top of another with the Mo layer closest to the substrate 100 (lowermost in the Z axis direction).

The upper electrode 817 is composed of: an ITO layer; a Mo layer; and a Cu layer, layered in this order one on top of another with the ITO layer closest to the substrate 100 (lowermost in the Z axis direction). Thus, in the display panel 80, electrodes and wiring in the TFT device part are made of Cu material, which has low electrical resistance. This suppresses a delay in communication of voltage pulse that may otherwise occur when in large panels with long wiring length, and consequently suppresses unevenness in displayed images. The following document may be referred to for information regarding wiring resistance.

(Reference Document) P-33: Cu—Mn Electrodes for a SiTFT and Its Electrical Characteristics, Junichi Koike et al., SID Symposium Digest of Technical Paper Volume 41, Issue 1, pages 1343-1346, May 2010

The following provides examples of the materials and thicknesses of the respective layers composing the electrodes 802, 809, 810, and 817.

Gate electrode 802: Cu Layer with 200 nm thickness and Mo layer with 20 nm thickness Source electrode 810 and drain electrode 809: CuMn layer with 20 nm thickness, Cu layer with 300 nm thickness, and Mo layer with 20 nm thickness Upper electrode 817: Cu layer with 300 nm thickness, Mo layer with 30 nm thickness, and ITO layer with 70 nm thickness Further, the TFT device part of the display panel 80 includes a passivation layer 816. The passivation layer 816 is composed of: a lower insulating layer 8161; a barrier layer 8162; and an upper insulating layer 8163, layered in this order one on top of another with the lower insulating layer 8161 closest to the substrate 100 (lowermost in the Z axis direction). The lower insulating layer 8161 is made of SiO, and the barrier layer 8162 is made of AlOx. The upper insulating layer 8163 is composed of: a SiO layer and a SiN layer, layered in this order one on top of another with the SiO layer closer to the substrate 100 (lower in the Z axis direction).

2. Thicknesses and Processing Conditions of Layers 8161-8163 of Passivation Layer As discussed above, in the TFT device part of the display panel 80, the electrodes 802, 809, 810, 814, 815, 817 are made of Cu material. Accordingly, it is necessary to define the thicknesses and processing conditions of the lower insulating layer 8161 and the upper insulating layer 8163 of the passivation layer 816 taking this into consideration. In the following, the thicknesses and processing conditions of the lower insulating layer 8161 and the upper insulating layer 8163 are described, one layer at a time.

(1) Lower Insulating Layer 8161

(i) Thickness

It is preferable that the lower insulating layer 8161 have a thickness of at least 200 nm.

As illustrated in FIG. 12A, with a lower insulating layer only having a thickness of 50 nm, a cavity is formed in the upper electrode at a corner portion thereof at the bottom of the contact hole. According to observation conducted by the present inventor, a lower insulating layer with 50 nm thickness produced a cavity with the size of 120 nm. Similarly, a lower insulating layer with 100 nm thickness also produced a cavity in the upper electrode, and the cavity had a size of 60 nm.

Conversely, a lower insulating layer with 200 nm thickness did not produce a cavity in the upper electrode, as illustrated in FIG. 12C.

Having found the correlation between lower insulating layer thickness and the forming of a cavity in the upper electrode, the present inventor proceeded to considering how the cavity in the upper electrode is formed (referred to in the following as cavity-forming mechanism). The following explains the cavity-forming mechanism with reference to FIGS. 13A and 13B.

When depositing the upper electrode through sputtering, metal particles travel as illustrated by the arrows in FIGS. 13A and 13B. As the deposition of the upper electrode progresses, metal particles, due to migration, gather and accumulate at an inner wall 8661a of the lower insulating layer 8661 that defines the contact hole, in particular at a center portion of the inner wall 8661a in the depth direction of the contact hole (i.e., a center portion in the Z axis direction). This results in the accumulation of the metal particles progressing further at the center portion of the inner wall 8661a than at other portions of the inner wall 8661a. This accumulation of metal particles blocks metal particles from arriving at the bottom portion (corner portion) of the inner wall 8661a, which is indicated by the arrow in FIG. 13A. The present inventor assumes that this is how a cavity is formed in the upper electrode when the lower insulating layer 8661 has smaller thickness than desirable.

Meanwhile, when providing the lower insulating layer 8161 with a thickness of at least 200 nm, the Z-direction height of the inner wall 8161*a* increases accordingly, as illustrated in FIG. 13B. Due to this, even when the accumulation of metal particles progresses at the center portion of the inner wall 8161*a* as described above, the accumulation does not block metal particles from arriving at the bottom portion (corner portion) of the inner wall 8161*a*. The present inventor assumes that this is why a cavity is not formed in the upper electrode when the lower insulating layer 8161 has a thickness of at least 200 nm.

As such, in order to guarantee device function, it is preferable that the lower insulating layer 8161 have a film thickness of at least 200 nm.

Further, in order to prevent the forming of a cavity in the upper electrode 817, it is preferable that the lower insulating layer 8161 have as great a thickness as possible, with the minimum being 200 nm. Also, in order to reduce the influence that fixed charge generated in the barrier layer 8162 and at the interfaces between the barrier layer 8162 and the layers sandwiching the barrier layer 8162 has on the channel layers 104 and 105, it is preferable that the lower insulating layer 8161 have as great a thickness as possible.

However, the greater the thickness of the lower insulating layer 8161, the longer the amount of time required for forming the lower insulating layer 8161, forming the contact hole, etc. Thus, in order to reduce manufacturing cost, it is preferable to limit the thickness of the lower insulating layer 8161 to no greater than 600 nm.

(ii) Film Forming Conditions

<Temperature> It is preferable that the lower insulating layer 8161 be formed under a temperature no higher than 230 degrees Celsius. If the lower insulating layer 8161 were to be formed under a temperature higher than 230 degrees Celsius, deposition of Mn from the CuMn layer in each of the source electrode 810 and the drain electrode 809 occurs. This is problematic, resulting in roughness of the surfaces of the source electrode 810 and the drain electrode 809. The source electrode 810 and the drain electrode 809 having rough surfaces further results in a decrease of adhesiveness of the source electrode 810 and the drain electrode 809 with respect to the lower insulating layer 8161, and also a decrease in contact between the source electrode 810 and the upper electrode 817. Considering this, it is preferable that the lower insulating layer 8161 be formed under a temperature no higher than 230 degrees Celsius.

<Gas> It is preferable that the gas used for forming the lower insulating layer 8161 include $N_2O$ gas not diluted with Ar gas. However, typically, $N_2O$ gas is diluted with Ar gas, for cost reduction.

However, the introduction of Ar gas results in high energy Ar collision during the forming of the lower insulating layer 8161, which in turn results in Ar penetrating through the channel protection layer 106 and arriving at and damaging the channel layer 105.

Further, it is preferable that the flow amount of $SiH_4$ gas be defined to satisfy $SiH_4/(SiH_4+N_2O)<1.1\%$. Limiting the flow amount of $SiH_4$ gas in such a manner reduces the amount of hydrogen (H) in the lower insulating layer 8161, and also reduces damage caused by hydrogen (H) during the forming of the lower insulating layer 8161.

<Contact Hole Processing> The forming of the contact hole through the lower insulating layer 8161 is performed through taper etching and etching using $CF_4/O_2$ gas. Embodiment 1 includes description related to this point.

(2) Upper Insulating Layer (i) Thickness

As already discussed above, in the passivation layer 816 pertaining to the present embodiment, the upper insulating layer 8163 is composed of a SiO layer and a SiN layer, layered in this order one on top of another with the SiO layer closer to the substrate 100. It is preferable that the SiO layer have a thickness of at least 100 nm, and that the SiN layer have a thickness of at least 200 nm. Such thicknesses guarantee a withstand voltage of at least 200 V between the upper electrode 817 and the combination of the source electrode 810 and the drain electrode 809.

The present inventor created four samples each including an upper insulating layer composed of a SiO layer and a SiN layer. The present inventor varied the combination of the thickness of the SiO layer and thickness of the SiN layer among the four samples. Using the samples, the present inventor measured the withstand voltage between the upper electrode and the combination of the source electrode and drain electrode for each of the samples. FIGS. 14A through 14D each illustrate the result of the measurement for a different one of the four samples. Note that the SiO layer and the SiN layer were formed under a temperature of 290 degrees Celsius in all samples. Note that forming the SiO layer and the SiN layer under a different temperature provides the layers formed with different characteristics, and thus, results in a change in the relation between layer thicknesses and withstand voltage. That is, the relation between different layer thicknesses and the withstand voltage described in the following are mere examples for the temperature of 290 degrees Celsius.

Sample (a): No SiN layer, SiO layer with 260 nm thickness

Sample (b): SiN layer with 100 nm thickness and SiO layer with 100 nm thickness

Sample (c): SiN layer with 100 nm thickness and SiO layer with 200 nm thickness

Sample (d): SiN layer with 200 nm thickness and SiO layer with 100 nm thickness

The amount of leak current at the same eight measurement points in each sample panel was measured as an indicator of the withstand voltage.

The upper insulating layer composed of only an SiO layer had a withstand voltage of 40V or lower (graph (d) in FIG. 14). Meanwhile, the two upper insulating layers having both a SiN layer and a SiO layer had a withstand voltage of 60 V or higher (graph (b) in FIG. 14) and a withstand voltage of 80 V or higher (graph (c) in FIG. 14).

Meanwhile, then upper insulating layer including a SiN layer with 200 nm thickness and a SiO layer with 100 nm thickness achieved a withstand voltage of 200 V or higher (graph (d) in FIG. 14), which is a withstand voltage sufficient for a large-sized panel.

As illustrated in FIG. 15, the thicknesses $t_1$, $t_2$, $t_3$ of the respective layers 8161, 8162, 8163 composing the passivation layer are defined as follows, for example.

Thickness $t_1$ of lower insulating layer 8161 (SiO layer)= 200 nm

Thickness $t_2$ of barrier layer 8162 (AlOx layer)=30 nm

Thickness $t_3$ of upper insulating layer 8163 (combination of SiN layer and SiO layer)≥200 nm (thickness of SiN layer at least 200 nm and thickness of SiO layer at least 100 nm)

Among such layers, the lower insulating layer 8161 does not contribute much to the withstand voltage of the passivation layer 816. This is since the lower insulating layer 8161 is made of SiO, and further, since the lower insulating layer 8161 cannot be formed with high quality due to requiring a low temperature (temperature lower than 230 degrees Celsius) in the forming thereof. In addition, the barrier layer 8162 also does not contribute much to the withstand voltage of the passivation layer 816, due to having an extremely small thickness of 30 nm.

Meanwhile, as illustrated in graph (d) in FIG. 14, the thickness of the SiN layer of the upper insulating layer 8163 contributes much to the withstand voltage of the passivation layer 816. Thus, in order to ensure withstand voltage of a desirable level, it is preferable that the upper insulating layer 8163 in the passivation layer 816, or more specifically, the SiN layer of the upper insulating layer 8163 have a thickness of at least 200 nm.

(ii) Film Forming Conditions

<Temperature> It is preferable that the forming of the upper insulating layer 8163 be performed under a temperature higher than 230 degrees Celsius and lower than 300 degrees Celsius. Forming the upper insulating layer 8163 under a temperature within such a range is preferable to guarantee a desirable level of adhesiveness between the upper insulating layer 8163 and the barrier layer 8162 in the passivation layer 816, and to suppress deformation of the source electrode 810 and the drain electrode 809.

First, a result of measurement conducted regarding the adhesiveness between the upper insulating layer 8163 and the barrier layer 8162 is discussed, with reference to FIGS. 16A and 16B. FIG. 16A illustrates a case where the upper insulating layer 8163 was formed under a temperature of 230 degrees Celsius. FIG. 16B illustrates a case where the upper insulating layer 8163 was formed under a temperature of 290 degrees Celsius. FIGS. 16A and 16B each show a microscope photograph taken after the forming of the contact hole, and indicate whether upward separation of the upper insulating layer 8163 from the barrier layer 8162 is occurring. The film forming conditions other than the temperature under which the upper insulating layer 8163 was formed are as provided in the following.

Lower insulating layer 8161: SiO layer with 200 nm thickness, formed under temperature of 230 degrees Celsius Barrier layer 8162: AlOx layer with 30 nm thickness, formed under room temperature Upper insulating layer 8163: combination of SiN layer with 200 nm thickness and SiO layer with 100 nm thickness Annealing performed after forming of upper insulating layer 8163: performed for one hour under temperature of 300 degrees Celsius and in a dry air atmosphere In the present embodiment, annealing is performed after the upper insulating layer 8163 is formed for the following reasons. Typically, when forming a layer made of silicon oxide, silicon nitride, or silicon oxynitride, or a layer composed of two or more layers each made of silicon oxide, silicon nitride, or silicon oxynitride, the substrate is put in a vacuum. Due to this, deoxidization of the channel layer 105 made of an oxide semiconductor occurs, and thus, the resistance of the channel layer 105 decreases. However, by performing annealing after the forming of the upper insulating layer 8163, the resistance of the channel layer 105 returns to a desirable high level. Further, the annealing also prevents deformation of the electrodes 802, 809, 810, which are located lower than the upper insulating layer 8163.

As illustrated in FIG. 16A, when the upper insulating layer 8163 is formed under a temperature of 230 degrees Celsius, upward separation of the upper insulating layer 8163 from the barrier layer 8162 after the forming of the contact hole occurs with high probability. The white portions in FIG. 16A around the contact holes are where this upward separation occurred.

Meanwhile, as illustrated in FIG. 16B, when the upper insulating layer 8163 was formed under a temperature of 290 degrees Celsius, upward separation of the upper insulating layer 8163 from the barrier layer 8162 did not occur even after the forming of the contact hole.

Further, although not illustrated in particular, the present inventor confirmed that the upward separation did not occur with much probability, provided that the upper insulating layer 8163 was formed under a temperature higher than 230 degrees Celsius. In particular, the present inventor confirmed that by forming the upper insulating layer 8163 under a temperature at least 250 degrees Celsius, the upward separation, even if formed, did not bring rise to any practical problems.

The following explains problems arising when forming the upper insulating layer 8163 under a temperature equal to or higher than 300 degrees Celsius, with reference to FIG. 17.

FIG. 17 shows a microscope photograph of a case where forming of the upper insulating layer 8163 was performed under a temperature of 300 degrees Celsius. As illustrated in FIG. 17, when the upper insulating layer 8163 was formed under a temperature of 300 degrees Celsius, deformation of the Cu layer in the source and drain electrodes occurred, due to Cu migration (i.e., Cu deformation portions were formed). The Cu deformation portion so formed penetrates through the passivation layer, and forms a short circuit with the upper electrode above the passivation layer.

In view of the above, it is preferable that the upper insulating layer 8163 of the passivation layer 816 be formed under a temperature lower than 300 degrees Celsius.

(iii) Relation Between Resistance of Channel Layer 105 and Characteristics and Thickness of SiN Layer of Upper Insulating Layer In the present embodiment, Cu material is used for the electrodes 802, 809, 810, 814, 815, 817. This reduces wiring resistance in the panel, and thus, ensures compatibility with large-sized panels. However, forming such electrodes by using Cu material has a drawback. That is, the diffusion coefficient of hydrogen (H) in the electrodes made by using Cu is relatively high. In specific, the diffusion coefficient of H in Cu under a temperature of 300 degrees Celsius is $10^{-6}$ cm$^2$/s, which is greater by one digit than the diffusion coefficient of H in Mo under the same temperature. Thus, by using Cu material for the electrodes, the risk increases of H reaching the channel layer 105 via the Cu in the electrodes (referred to as via-Cu H propagation), which brings about an undesirable rise in the carrier density in the channel layer 105 and the consequent decrease in the resistance of the channel layer 105. This ultimately results in the voltage threshold Vth of the transistor shifting from plus to minus. For example, the following document may be referred to for information regarding the mechanism of the via-Cu H propagation.

(Reference Document) Diffusion of Hydrogen in Materials, H. Wipf, Topics in Applied Physics, Vol. 73, Springer-Verlag Berlin Heidelberg 1997

By various heat-related processes being performed after the forming of the contact hole, H separates from the SiN layer of the upper insulating layer, and the propagation of such H takes place. Further, under certain circumstances, the H from the SiN layer may reach the channel layer via, for example, a Cu electrode extending along the inner walls defining the contact hole. The mechanism of such propagation of H is described in the following based on two specific examples.

The first example is illustrated in FIG. 18A. FIG. 18A illustrates a configuration where a passivation layer 826 is composed of four layers, namely layers 8261, 8262, 8263, and 8264, and an upper insulating layer 8264 that is located uppermost in the Z axis direction among such layers is made of SiN. Further, a contact hole 826a is formed in the passivation layer 826, and an ITO layer 827 is formed in the contact hole 826a, as a part of the upper electrode. With this configuration, it is necessary to conduct a crystallization process with respect to the ITO layer 827 before disposing any layer on the ITO layer 827, and this crystallization process involves heating.

In specific, the heating in the crystallization process of the ITO layer 827 is performed for 30 minutes under a temperature of 250 degrees Celsius and in a dry air atmosphere. When this heating is conducted, as illustrated in FIG. 18A, H that separates from the SiN layer of the upper insulating layer 8264 arrives at the channel layer 105 made of an oxide semiconductor, after travelling through the ITO, the source electrode 810, and the source lower electrode 815 in this order. As a result, the oxide semiconductor of the channel layer 105 is deoxidized by the H, and thus, the electrical resistance of the channel layer 105 decreases.

The second example is illustrated in FIG. 18B. FIG. 18B illustrates a configuration where after the forming of an upper electrode 837 in the TFT device part, an interlayer insulating layer 838 is deposited to cover the upper electrode 837, and further, a contact hole 838a is formed in the interlayer insulating layer 838. The contact hole 838a is for connecting the upper electrode 837 with an anode. Here, the upper electrode 837 is made of Cu material, similar to the upper electrode 817 in embodiment 5.

As illustrated in FIG. 18B, heating is conducted after forming the contact hole 838a in the interlayer insulating layer 838. The heating is performed, for example, for one hour under a temperature of 250 degrees Celsius. When the heating (baking) of the interlayer insulating layer 838 is conducted, H that separates from the SiN layer of the upper insulating layer 8264 arrives at the channel layer 105 made of an oxide semiconductor after travelling through the upper electrode 837, the source electrode 810, and the source lower electrode 815 in this order. As a result, the oxide semiconductor of the channel layer 105 is deoxidized by the H, and thus, the electrical resistance of the channel layer 105 decreases.

Thus, it can be seen that a low H content in the SiN layer of the upper insulating layer is desirable (i.e., it is preferable that the binding ratio between Si—H to N—H be set low).

Further, providing the upper insulating layer with increased thickness results in an improvement in the withstand voltage between the upper electrode and the combination of the source electrode and the drain electrode. Meanwhile, providing the upper insulating layer with increased thickness results in an increase in the total amount of H in the upper insulating layer. Thus, it is preferable not to provide the upper insulating layer with a thickness greater than necessary.

(iv) Film Characteristics and Film Stress of Upper Insulating Layer

The upper insulating layer is formed to have stress in a compression direction. In view of this, it is preferable that the film-forming conditions of the upper insulating layer be defined considering both the characteristics of the upper insulating layer and prevention of deformation of the substrate 100. This is discussed in the following, with reference to FIGS. 19A and 19B, and FIGS. 20A and 20B.

Test samples were prepared in order to confirm the stress that the upper insulating layer has when formed. As illustrated in FIG. 20A, each test sample was prepared by adhering a sample Si substrate to each of a center portion $P_{cent}$ and a corner portion $P_{edge}$ of a Generation 8.5 glass substrate typically having a width of 2500 mm, a height of 2200 mm, and a thickness of 0.7 mm. The corner portion $P_{edge}$ was set near an orientation flat (chamfered portion) of the glass substrate, which enables distinction between front and rear sides of the substrate and distinction of the orientation of the substrate. The orientation flat is not illustrated in FIG. 20A.

Further, on each of the text samples, a film of SiN was formed by using a PECVD (Plasma-enhanced Chemical Vapor Deposition) device, while varying the film forming conditions applied in the forming of the SiN film among the test samples. Thus, samples 1 through 3 were prepared. FIG. 19B illustrates the different film forming conditions applied for the samples 1 through 3. Note that for each of the samples 1 through 3, the film forming duration of the SiN film was adjusted so that the SiN film formed had a thickness of 400 nm. Further, the data provided in FIG. 19B were acquired and assessed under the following conditions.

Note that the values indicating gas flow amount in FIG. 19B are values acquired under a temperature of 25 degrees Celsius and 100 kPa.

(Film Thickness) The thickness of each SiN film was measured by using a spectroscopic ellipsometer.

(Substrate Stress) Substrate stress was assessed based on the film thickness of the SiN film and the difference between warping amounts (curvature radius) at different portions of the substrate having the SiN film formed thereon, by using a thin film stress measurement device.

(SiH/NH value) The SiN and NH binding amounts in each SiN film were assessed through Fourier transform infrared spectroscopy, and the SiH/NH value was calculated from the binding amounts.

The following document may be referred to for information related to the assessment of the SiH and NH binding amounts.

(Reference Document) J. Appl. Phys., 49(4), 2473 (1978), W. A. Lanford, W. J. Rand The following explains the data provided in FIG. 19B, by referring to the samples one by one.

<Sample 1> The SiN film in sample 1 was formed at a higher film forming rate than the SiN films in samples 2 and 3, and the average stress was close to zero. Further, the SiN film had high H content (i.e., high SiH/NH ratio).

<Sample 2> The SiN film in sample 2 was formed at a film forming rate similar to the film forming rate at which the SiN film in sample 3 was formed, and had a SiH/NH ratio no greater than 0.10. Further, the average stress was close to zero.

<Sample 3> As described above, the SiN film in sample 3 was formed at a film forming rate similar to the film forming rate at which the SiN film in sample 3 was formed, and had a SiH/NH ratio similar to that of the SiN film in sample 2. Further, stress in the compression direction was generated in sample 3.

Subsequently, TFTs were prepared each including one of the SiN films pertaining to samples 1 through 3, the physical characteristics of which already discussed above. Further, the characteristics of the TFTs so prepared were assessed. FIGS. 20A and 20B illustrate the results of the assessment. Note that the TFTs were prepared according to the method described above.

(Relation Between Threshold Voltage Vth and Thicknesses of SiN Films in Samples 1 through 3)

FIG. 20A illustrates results of assessing the electrical characteristics (Id (drain current)–Vg (gate voltage)) of the TFTs prepared using the samples 1 through 3, at Vds (drain-source voltage)=4.1 V.

All of the TFTs prepared by using the samples 1 through 3 initially exhibited a mobility of approximately 10 cm²/Vs. Meanwhile, as illustrated in FIG. 20A, the threshold voltages Vth of the TFTs were dependent upon the conditions of the SiN films included therein. In specific, it was observed that the threshold voltage Vth became 1 V or lower in TFTs prepared using samples 1 including SiN films with thicknesses of 200 nm or greater.

The present inventor assumed that this decrease in threshold voltage Vth occurred for the following reason. The SiN film in sample 1 contained high H content. Due to this, H separating from the SiN film according to the mechanism discussed above reaches the channel layer via electrode portions made of Cu material. This results in high carrier density in the channel layer, and a consequent decrease in resistance of the channel layer.

Meanwhile, such a decrease in threshold voltage Vth was not observed with the TFTs prepared using samples 2 and 3, in which the SiH/NH ratio was no greater than 0.10. This indicates that the decrease in threshold voltage Vth can be suppressed by providing the SiN film of the upper insulating layer with a SiH/NH ratio of 0.10 or smaller, although electrodes made of Cu material tend to allow H pass through easily even if the passivation layer includes a barrier layer made of AlOx.

(Substrate Warping)

Further, when a great amount of stress, or more particularly, a great amount of stress in the compression direction is generated in the SiN layer having been formed, the substrate receives a great amount of force causing the substrate to warp such that the center portion of the substrate protrudes higher than the end portions of the substrate. Such substrate warping may cause failure in substrate transportation and/or substrate damage. In specific, when transporting the substrate via a conveyance roller in a device (e.g., a device performing photolithography, a device performing wet etching, or a device performing peeling and cleansing), an end of the substrate may cling to the roller. Further, under certain circumstances, the substrate may even crack.

In order to evaluate whether such a problem occurs, the following measurement was performed. In specific, after forming a contact hole connecting the upper electrode and the anode, substrate droop amount was measured after photoresist removal. FIG. 20B illustrates the results of this measurement.

Note that the data provided in the FIG. 20B was acquired by mounting each substrate on a stage whose edges, with the substrate mounted thereon, are located 20 cm inwards than the peripheral edges of the substrate. Further, with each substrate mounted on such a stage, a droop amount of substrate edges (i.e., the length of substrate edge portions drooping down from a horizontal reference plane) was measured.

As illustrated in FIG. 19B, the amount of stress in the compression direction generated in sample 3 was approximately 300 MPa. Further, as illustrated in FIG. 20B, the substrate droop amount in sample 3 was 4.25 mm when the thickness of the SiN film was 100 nm, and 4.5 mm when the thickness of the SiN film was 200 nm. Thus, with sample 3, a tendency was observed such that the greater the thickness of the SiN film, the greater the substrate droop amount.

Meanwhile, the average stress on the substrate was close to zero for each of samples 1 and 2. Thus, as illustrated in FIG. 20B, substrate droop amount did not increase even for SiN films with greater thickness.

In view of the above, in order to limit substrate droop amount within a desirable level, it is preferable that film forming conditions of the upper insulating layer be defined such that generated stress is within a range of ±150 MPa inclusive.

[Other Matters]

Embodiments 1, 2, and 5 each describe a passivation layer composed of three layers. Meanwhile, embodiment 3 describes a passivation layer composed of five layers, and embodiment 4 describes a passivation layer composed of four layers. Nevertheless, the passivation layer may be composed of six or more layers. However, in any case, it is preferable that in the passivation layer, a barrier layer made of AlOx be sandwiched between insulating layers each made of SiO, SiN, or SiON. Further, considering the amount of time required for forming the passivation layer, it is preferable that the passivation layer have a thickness of 1000 nm or less (more preferably, a thickness of 600 nm or less), such as the passivation layer in embodiment 1, in order to guarantee a desirable level of production efficiency.

Each of embodiments 1 through 5 describes an EL display panel of the top-emission type. However, the technology pertaining to the present disclosure is not only applicable to top-emission type EL display panels. That is, the technology pertaining to the present disclosure is also applicable to bottom-emission type display panels, and also, to liquid crystal panels, field emission display panels, electronic papers, and the like.

Each of embodiments 1 through 4 describes a configuration where two transistor elements ($Tr_1$, $Tr_2$) are provided for each subpixel 10a. However, the technology pertaining to the present disclosure is not only applicable to such a configuration. That is, the technology pertaining to the present disclosure is also applicable, for example, to a configuration where only one transistor element is provided for each subpixel, or a configuration where three or more transistor elements are provided for each subpixel.

In connection with this, in embodiment 5, description is provided based on only one transistor element. Nevertheless, as described above, embodiment 5 is applicable to a configuration where two or more transistor elements are provided for each subpixel.

Further, each constituent element may be formed by using any suitable material. For example, the barrier layer of the passivation layer need not be made of AlOx, and instead, may be made of a nitride containing Al, or an oxynitride containing Al.

Further, the gate electrodes, source electrodes, and drain electrodes need not have the structures described above. For example, each of such electrodes may be composed of a combination of a Mo layer and an Al layer, or a combination of a Mo layer and a metal alloy layer made of Al and Nd.

In embodiment 5, the upper insulating layer 8163 of the passivation layer 816 is made of SiN. Alternatively, the upper insulating layer 8163 may be made of SiON.

Further, each of embodiments 1 through 4 describes a configuration where an anode (119, 319, 519, 719) is located at a bottom portion of the EL element part, and the anode is connected to the source electrode 110 of the TFT device part. However, the technology pertaining to the present disclosure is not only applicable to such a configuration. That is, the technology pertaining to the present disclosure is applicable to a configuration where a cathode is provided at the bottom portion of the EL element part, and an anode is provided at the top portion of the EL element part. With such a configuration, the cathode at the bottom portion of the EL element part is connected to a drain of the TFT device part.

In addition, any suitable known material may be used for any of the constituent elements.

INDUSTRIAL APPLICABILITY

The technology pertaining to the present disclosure is useful for realizing a thin film transistor device that has excellent electrical characteristics, and that can be manufactured with high yield due to having high processability.

REFERENCE SIGNS LIST

1 Display device
10, 30, 50, 70, 80 Display panel
10a Subpixel
20 Drive/control circuit
21-24 Drive circuit
25 Control circuit
100, 130 Substrate
101, 102, 802 Gate electrode
103, 1030 Gate insulating layer
104, 105 Channel layer
106, 1060 Channel protection layer
107, 110, 810 Source electrode
108, 109, 809 Drain electrode
111, 115, 815 Source lower electrode
112, 114, 814 Drain lower electrode
113 Contact plug
116, 316, 516, 716, 816, 826 Passivation layer
117, 317, 517, 717, 817, 837 Upper electrode
118, 318, 331, 518, 718, 838 Interlayer insulating layer
119, 319, 519, 719 Anode
120 Hole injection layer
121 Bank
122 Hole transport layer
123 Light-emitting layer
124 Electron transport layer
125 Cathode
126 Sealing layer
127 Adhesion layer
128 Color filter layer
129 Light-blocking layer
827 ITO layer
1161, 3161, 5161, 7161, 8161, 8261, 11610 Lower insulating layer
1162, 3162, 5162, 7162, 8162, 8262, 11620 Barrier layer
1163, 3163, 5163, 5164, 5165, 7163, 7164, 8163, 8263, 8264, 11630 Upper insulating layer
EL EL element part
Tr$_1$ Driving transistor element
Tr$_2$ Switching transistor element
C Capacitor

The invention claimed is:

1. A thin film transistor device comprising:
a substrate;
a gate electrode above the substrate;
a channel layer above the gate electrode;
an electrode pair on the channel layer, the electrode pair composed of a source electrode and a drain electrode that are spaced from one another;
a passivation layer extending over the gate electrode, the channel layer, and the electrode pair, the passivation layer having a hole penetrating therethrough in a thickness direction; and
an electrically-conductive layer having a portion extending along an inner wall of the passivation layer defining the hole in the passivation layer, and a portion connecting to one of the gate electrode, the source electrode, and the drain electrode at a bottom of the hole in the passivation layer,
wherein
the channel layer is made of an oxide semiconductor,
the passivation layer includes a first layer, a second layer, and a third layer layered one on top of another in this order with the first layer closest to the substrate, the first layer made of one of silicon oxide, silicon nitride, and silicon oxynitride, the second layer made of an Al compound, the third layer made of silicon nitride,
the passivation layer further includes a fourth layer on the third layer, the fourth layer made of silicon nitride, and
the fourth layer contains silicon nitride at a lower density than the third layer.

2. A thin film transistor device comprising:
a substrate;
a gate electrode above the substrate;
a channel layer above the gate electrode;
an electrode pair on the channel layer, the electrode pair composed of a source electrode and a drain electrode that are spaced from one another;
a passivation layer extending over the gate electrode, the channel layer, and the electrode pair, the passivation layer having a hole penetrating therethrough in a thickness direction; and
an electrically-conductive layer having a portion extending along an inner wall of the passivation layer defining the hole in the passivation layer, and a portion connecting to one of the gate electrode, the source electrode, and the drain electrode at a bottom of the hole in the passivation layer,
wherein
the channel layer is made of an oxide semiconductor,
the passivation layer includes a first layer, a second layer, and a third layer layered one on top of another in this order with the first layer closest to the substrate, the first layer made of one of silicon oxide, silicon nitride, and silicon oxynitride, the second layer made of an Al compound, the third layer made of silicon oxide,
the passivation layer further includes a fourth layer on the third layer, the fourth layer made of one of silicon nitride and silicon oxynitride,
at least one of the source electrode and the drain electrode contains Cu or a Cu alloy,
the fourth layer has a thickness of at least 200 nm, and
the third layer has a thickness of at least 100 nm.

3. A thin film transistor device comprising:
a substrate;
a gate electrode above the substrate;
a channel layer above the gate electrode;
an electrode pair on the channel layer, the electrode pair composed of a source electrode and a drain electrode that are spaced from one another; and
a passivation layer extending over the gate electrode, the channel layer, and the electrode pair, the passivation layer having a hole penetrating therethrough in a thickness direction,
wherein
the channel layer is made of an oxide semiconductor, and
the passivation layer includes a first layer, a second layer, and a third layer layered one on top of another in this order with the first layer closest to the substrate, the first layer made of one of silicon oxide, silicon nitride, and silicon oxynitride, the second layer made of an Al compound, the third layer made of one of silicon oxide, silicon nitride, and silicon oxynitride, the thin film transistor device further comprises an interlayer insulating layer between the first layer and at least one of the gate electrode, the source electrode, and the drain electrode, the interlayer insulating layer has a hole penetrating therethrough and overlapping with the hole in the passivation layer, and the thin film transistor device further comprises an electrically-conductive layer having a portion extending along an inner wall of the interlayer insulating layer defining the hole in the interlayer insulating layer, a portion connecting to one of the gate electrode, the source electrode, and the drain electrode at a bottom of the hole in the interlayer insulating layer, and a portion residing between the interlayer insulating layer and the first layer.

* * * * *